United States Patent
Satou et al.

(10) Patent No.: US 7,049,036 B1
(45) Date of Patent: May 23, 2006

(54) PHOTOSENSITIVE RESIN COMPOSITION, PHOTOSENSITIVE ELEMENT USING THE SAME, METHOD FOR PRODUCING RESIST PATTERN, RESIST PATTERN AND SUBSTRATE HAVING THE RESIST PATTERN LAMINATED THEREON

(75) Inventors: Kuniaki Satou, Ibaraki-ken (JP); Takahiko Kutsuna, Ibaraki-ken (JP); Toshizumi Yoshino, Ibaraki-ken (JP); Takao Hirayama, Ibaraki-ken (JP); Mikio Uzawa, Ibaraki-ken (JP)

(73) Assignee: Hitachi Chemical Co., Ltd., Tokyo (JP)

( * ) Notice: Subject to any disclaimer, the term of this patent is extended or adjusted under 35 U.S.C. 154(b) by 116 days.

(21) Appl. No.: 10/110,219

(22) PCT Filed: Oct. 23, 2000

(86) PCT No.: PCT/JP00/07380

§ 371 (c)(1),
(2), (4) Date: May 31, 2002

(87) PCT Pub. No.: WO01/29616

PCT Pub. Date: Apr. 26, 2001

(30) Foreign Application Priority Data

| Oct. 22, 1999 | (JP) | 11/300995 |
| Oct. 28, 1999 | (JP) | 11/307516 |
| Oct. 29, 1999 | (JP) | 11/307946 |
| Oct. 29, 1999 | (JP) | 11/307947 |

(51) Int. Cl.
G03F 7/038 (2006.01)
G03F 7/30 (2006.01)

(52) U.S. Cl. .................. 430/17; 430/270.1; 430/280.1; 430/325

(58) Field of Classification Search .............. 430/270.1, 430/280.1, 325, 17
See application file for complete search history.

(56) References Cited

U.S. PATENT DOCUMENTS

| 3,899,611 A | 8/1975 | Hall |
| 4,247,621 A | 1/1981 | Sano et al. |
| 4,803,115 A * | 2/1989 | Fushiki et al. ............... 442/234 |
| 4,812,489 A | 3/1989 | Watanabe et al. |
| 4,948,700 A * | 8/1990 | Maeda et al. ............. 430/280.1 |
| 5,124,234 A | 6/1992 | Wakata et al. |
| 5,158,999 A * | 10/1992 | Swales et al. ............... 524/100 |
| 5,604,080 A | 2/1997 | Suzuki et al. |
| 5,674,947 A * | 10/1997 | Oishi et al. .................. 525/289 |
| 5,677,450 A | 10/1997 | Suzuki et al. |
| 5,858,616 A | 1/1999 | Tanaka et al. |
| 6,077,647 A | 6/2000 | Tanaka et al. |
| 6,139,998 A * | 10/2000 | Mochizuki et al. ........... 430/56 |
| 6,248,501 B1 | 6/2001 | Tanaka et al. |
| 6,596,893 B1 * | 7/2003 | Nakacho et al. ............. 558/157 |

FOREIGN PATENT DOCUMENTS

| EP | 0768573 | 4/1997 |
| JP | 2-294371 | 12/1990 |
| JP | 8-292567 | 11/1996 |
| JP | 9-258446 | 10/1997 |
| JP | 11184087 | 7/1999 |
| JP | 11288090 | 10/1999 |
| JP | 20003039 | 1/2000 |
| JP | 20007974 | 1/2000 |

OTHER PUBLICATIONS www.cibasc.com Information about CIBA IRGACURE 907.*
JP 09-258446 A, Machine Translation provided by http://www. ipdl.jpo.go.jp/homepg_e.ipdl.*
English Language Abstract of JP 9-258446.
English Language Abstract of JP 11-184087.
English Language Abstract of JP 8-292567.
English Language Abstract of JP 11-288090.
English Language Abstract of JP 2-294371.
English Language Abstract of JP 2000-3039.
English Language Abstract of JP 2000-7974.

* cited by examiner

Primary Examiner—Richard L. Schilling
(74) Attorney, Agent, or Firm—Greenblum & Bernstein, P.L.C.

(57) ABSTRACT

Disclosed are a photosensitive resin composition comprising a photosensitive resin (A), a photopolymerization initiator (B), and a flame retardant (C), in which a content of halogen atoms or antimony atoms in the flame retardant is 5% or less by weight; a photosensitive element using this; a method of manufacturing a resist pattern; a resist pattern; and a resist pattern laminated substrate.

31 Claims, 1 Drawing Sheet

PHOTOSENSITIVE RESIN COMPOSITION, PHOTOSENSITIVE ELEMENT USING THE SAME, METHOD FOR PRODUCING RESIST PATTERN, RESIST PATTERN AND SUBSTRATE HAVING THE RESIST PATTERN LAMINATED THEREON

TECHNICAL FIELD

The present invention relates to a photosensitive resin composition, a photosensitive element using this, a method of manufacturing a resist pattern, a resist pattern, and a resist pattern laminated substrate.

BACKGROUND ART

Conventionally, solder mask resists in the manufacturing of printed wiring boards have been produced by the screen printing of thermosetting or ultraviolet-curing resist inks.

As electronic devices are becoming highly-integrated, higher precision in the wiring and insulation patterns of printed wiring boards is required, and it is difficult to form high precision resist images using the conventional production method of screen printing, due to the occurrence of smears and drips.

Therefore, a method of forming resist images using photolithography has been developed and various inks such as solder resists and marking resists have been improved from the conventional thermosetting type to a photosensitive type capable of image formation.

Furthermore, in the field of electric and electronic materials such as printed wiring boards and semiconductors, materials are required, with the aim of creating a better working environment and protecting the global environment, to be flame-retardant but free from halogen-based compounds and antimony-based compounds which can harm the environment. These requirements also apply to a photosensitive solder mask resist, as one of these electric and electronic materials. However, no photosensitive solder mask resist that is non-halogen-based, non-antimony-based with sufficient flame retardancy has as yet been developed. Therefore, problems have arisen where for example, when a non-halogen-based, non-antimony-based substrate and a solder resist are used in combination to manufacture a non-halogen printed wiring board, the resultant printed wiring board has not met flame retardancy standards because of the inflammability of the solder resist, despite the flame retardancy of the substrate.

DISCLOSURE OF INVENTION

It is an object of the present invention to provide a flame-retardant photosensitive resin composition to be used suitably in realizing non-halogen type manufacturing of printed wiring boards, semiconductor packages, and the like; which can yield a solder resist cured film superior in flame retardancy as well as heat resistance, mechanical characteristics, adhesion, and chemical resistance.

It is another object of the present invention to provide a photosensitive element to be used suitably in realizing non-halogen type manufacturing of printed wiring boards, semiconductor packages, and the like; which can yield a solder resist cured film superior in flame retardancy as well as heat resistance, mechanical characteristics, adhesion, chemical resistance, workability, and productivity.

It is yet another object of the present invention to provide a resist pattern, its manufacturing method, and a resist pattern laminated substrate to be used suitably in realizing non-halogen type manufacturing of printed wiring boards, semiconductor packages, and the like; which is superior in flame retardancy as well as heat resistance, mechanical characteristics, adhesion, chemical resistance, workability, and productivity.

According to the first aspect of the present invention, there is provided a photosensitive resin composition comprising a photosensitive resin (A), a photopolymerization initiator (B), and a flame retardant (C), in which a content of halogen atoms or antimony atoms in the flame retardant is 5% or less by weight. According to the second aspect of the present invention, there is provided a photosensitive resin composition comprising a photosensitive resin (A), a photopolymerization initiator (B), and a zinc compound (C1). According to the third aspect of the present invention, there is provided a photosensitive resin composition comprising a photosensitive resin (A), a photopolymerization initiator (B), and an organic nitrogen-based compound (C2). According to the fourth aspect of the present invention, there is provided a photosensitive resin composition comprising a photosensitive resin (A), a photopolymerization initiator (B), and a metal hydroxide (C3). According to the fifth aspect of the present invention, there is provided a photosensitive resin composition comprising a photosensitive resin (A), a photopolymerization initiator (B), and an organic phosphorus-based compound (C4).

By adopting each constituent, the photosensitive resin composition according to the present invention is superior in flame retardancy in spite of being substantially free from halogens and antimony, which allows the photosensitive resin composition to be used suitably in realizing non-halogen type manufacturing of printed wiring boards, semiconductor packages, and the like, and use of the photosensitive resin composition yields a solder resist cured film superior in flame retardancy as well as heat resistance, mechanical characteristics, adhesion, and chemical resistance.

According to another aspect of the present invention, there is provided a photosensitive element obtained by forming a resist layer formed by the photosensitive resin composition according to the present invention onto a substrate. This photosensitive element employs the photosensitive resin composition according to the present invention as a resist layer, which can yield a solder resist cured film superior in flame retardancy as well as heat resistance, mechanical characteristics, adhesion, chemical resistance, workability, and productivity and which can be used suitably in realizing non-halogen type manufacturing of printed wiring boards, semiconductor packages, and the like.

According to yet another aspect of the present invention, a manufacturing method of a resist pattern comprising the following steps is provided:
  i) a step of laminating a resist layer formed by the photosensitive resin composition according to the present invention onto a substrate;

ii) a step of irradiating active rays in an image shape to photo-cure the resist layer at exposed portions; and iii) a step of selectively removing the resist layer at unexposed portions by development, to form a resist pattern.

According to yet another aspect of the present invention, a resist pattern produced by the above-mentioned manufacturing method of a resist pattern is provided. Using the above-mentioned manufacturing method of a resist pattern, it is possible to obtain a resist pattern which is superior in flame retardancy as well as heat resistance, mechanical characteristics, adhesion, chemical resistance, workability, and productivity and which can be used suitably in realizing non-halogen type manufacturing of printed wiring boards, semiconductor packages, and the like.

According to yet another aspect of the present invention, a resist pattern laminated substrate is obtained by laminating a resist pattern obtained by using a resist layer formed by the photosensitive resin composition according to the present invention onto a substrate. This laminated substrate employs the photosensitive resin composition according to the present invention as a resist layer, and therefore is superior in flame retardancy as well as heat resistance, mechanical characteristics, adhesion, chemical resistance, workability, and productivity and can be used suitably in realizing non-halogen type manufacturing of printed wiring boards, semiconductor packages, and the like.

BEST MODE FOR CARRYING OUT THE INVENTION

Figure 1:
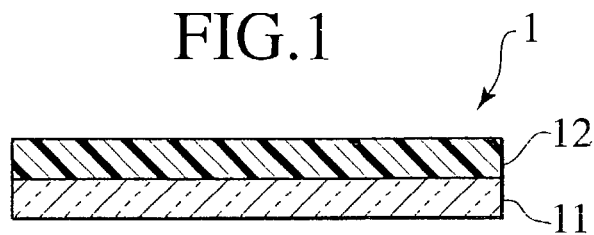
FIG. 1 is a schematic drawing which shows an embodiment of a photosensitive element.

Embodiments of the present invention will be described in detail hereinafter. In the following description, (meth)acrylic acid refers to acrylic acid and corresponding methacrylic acid, (meth)acrylate refers to acrylate and corresponding methacrylate, and (meth)acryloyl group refers to methacryloyl group and corresponding methacryloyl group.

The photosensitive resin composition according to the present invention (hereinafter referred to as 'composition X') comprises a photosensitive resin (A), a photopolymerization initiator (B), and a flame retardant (C), in which a content of halogen atoms or antimony atoms in the above-mentioned flame retardant is 5% or less by weight. Here, the content of halogen atoms or antimony atoms in the above-mentioned flame retardant is the amount of either or both halogen atoms and antimony atoms in the molecule, relative to the molecular weight of the flame retardant, in which the amount of halogen atoms or antimony atoms present in the flame retardant as impurities (for example, halogen atoms or antimony atoms in the catalyst used in the synthesis of the flame retardant compound) is not included. When the content of halogen atoms or antimony atoms in the above-mentioned flame retardant is 5% or less by weight, a flame-retardant photosensitive resin composition becomes substantially halogen- and antimony-free so that there is no damaging impact on the environment. The content of halogen atoms or antimony atoms in the flame retardant is preferably 3% or less by weight, more preferably 1% by weigh or less, even more preferably 0.5% or less by weight, and still more preferably 0.1% or less by weight. Most preferably, a flame retardant that contains neither halogen atoms nor antimony atoms is used.

The flame retardancy of the photosensitive resin composition X is preferably such that it can impart flame retardancy which satisfies UL94V-0 or V-1 in UL94V standards to a laminate formed by laminating a 50 µm thick layer of the photosensitive resin composition to the both sides of a 0.3 mm thick non-halogen copper-clad laminate. When this is the case, it is possible to provide a highly flame-retardant printed wiring board, by using it in combination with a non-halogen substrate, for example. Here, the above-mentioned non-halogen copper-clad laminate is 'MCR—RO-67G' manufactured by Hitachi Chemical Co., Ltd.

A photosensitive resin composition according to another aspect of the present invention (hereinafter referred to as 'composition I') comprises a photosensitive resin (A), a photopolymerization initiator (B), and a zinc compound (C1).

A photosensitive resin composition according to another aspect of the present invention (hereinafter referred to as 'composition II') comprises a photosensitive resin (A), a photopolymerization initiator (B), and an organic nitrogen-based compound (C2).

A photosensitive resin composition according to another aspect of the present invention (hereinafter referred to as 'composition III') comprises a photosensitive resin (A), a photopolymerization initiator (B), and a metal hydroxide (C3).

A photosensitive resin composition according to another aspect of the present invention (hereinafter referred to as 'composition IV') comprises a photosensitive resin (A), a photopolymerization initiator (B), and an organic phosphorus-based compound (C4).

The compositions I to IV preferably have the same characteristics of the content of halogen atoms and antimony atoms and the flame retardancy as described for the above-mentioned composition X.

Each component will be described hereinafter.

No limitation is imposed on a photosensitive resin (A) provided it has a photosensitive group. The photosensitive resin can be obtained, for example, by reacting a reaction product (A') of epoxy resin (a1) and unsaturated group-containing monocarboxylic acid (a2), with anhydride (a3) of saturated or unsaturated group-containing polybasic acid. In this case, it is believed that an epoxy group of the epoxy resin (a1) and a carboxylic group of the unsaturated group-containing monocarboxylic acid (a2) undergo an addition reaction in the first reaction to form a hydroxyl group, and the resultant hydroxyl group and an anhydride group of the anhydride (a3) of saturated or unsaturated group-containing polybasic acid undergo a half-ester reaction in the next reaction.

Examples of the above-mentioned epoxy resin (a1) include novolac-type epoxy resins, bisphenol-type epoxy resins, salicylic aldehyde-type epoxy resins, and rubber-modified epoxy resins. These compounds may be used singly or with two or more in combination.

Examples of the novolac-type epoxy resins preferably include phenol novolac-type epoxy resins, cresol novolac-type epoxy resins, and epoxy resins represented by the general formula (XII):

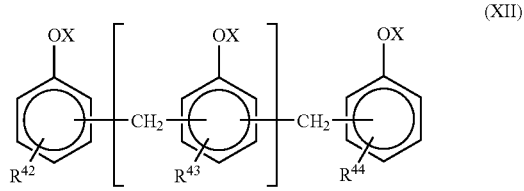

(XII)

(wherein X represents a hydrogen atom or a glycidyl group; each one of $R^{42}$ to $R^{44}$ independently represents a hydrogen atom or an alkyl group with 1–5 carbon atoms; and $k^1$ is an integer greater than or equal to 1).

The above-mentioned phenol novolac-type epoxy resins and cresol novolac-type epoxy resins can be obtained, for example, by reacting phenol novolac resins or cresol novolac resins with epichlorohydrin.

Examples of available novolac-type epoxy resins include EOCN-102S, EOCN-103S, EOCN-104S, EOCN-1020, EOCN-1025, EOCN-1027, EOCN-100, EOCN-3300, EOCN-4400, EP PN-201, RE-305, RE-306 (product names of Nippon Kayaku Co., Ltd.), YDPN-638, YDPN-638P, YDCN-701, YDCN-702, YDCN-703, YDCN-704, YDCN-500 (product names of Tohto Kasei Corporation), ESCN-195XL, ESCN-195XF, ESCN-195xHH, ESCN-220L, ESCN-220F, ESCN-220HH, ESCN-200L (product names of Sumitomo Chemical Co., Ltd.), 'EPICLON' series of N-660, N-665, N-667, N-670, N-673, N-680, N-690, N-695, N-665EXP, N-673-70M, N-680-75M, N-690-75M, N738, N-740, N-770, N-775, N-770-70M, N-865, and N-86570M (product names of Dainippon Ink and Chemicals, Incorporated). These compounds may be used singly or with two or more in combination.

Examples of the above-mentioned bisphenol-type epoxy resins preferably include bisphenol A-type epoxy resins, bisphenol F-type epoxy resins, bisphenol S-type epoxy resins, and epoxy resins represented by the general formula (XIII):

(wherein X has the same meaning as X in the general formula (XII); Y represents $-CH_2-$, $-C(CH_3)_2-$, or $-SO_2-$; $R^{45}$ to $R^{60}$ have the same meaning as $R^{42}$ in the general formula (XII); and $k^2$ is an integer greater than or equal to 1). These compounds may be used singly or with two or more in combination.

As the above-mentioned bisphenol-type epoxy resin, for example, a compound obtained by reacting a hydroxyl group of bisphenol-type resin with epichlorohydrin can be used.

The reaction is preferably conducted in a polar organic solvent such as dimethylformamide, dimethylacetoamide, and dimethylsulfoxide in the presence of an alkali metal hydroxide at a reaction temperature of about 50° C. to about 120° C. to accelerate the reaction of the hydroxyl group and epichlorohydrin. When the reaction temperature is below 50° C., the reaction tends to be slow, and when the temperature exceeds 120° C., more side reactions tend to occur.

Examples of available bisphenol-type epoxy resins include RE-310S, RE-304S, RE-404S (product names of Nippon Kayaku Co., Ltd.), YD-115, YD-115G, YD-115CA, YD-118P, YD-127, YD-128, YD-128G, YD-128S, YD-128CA, YD-134, YD-134N, YD-011, YD-012, YD-013, YD-014, YD-017, YD-019, YD-020, YD-8125, YD-7011R, YD-7014R, YD-7017, YD-7019, YD-7020, YD-900, YD-901, YD-902, YD-903, YD-904, YD-907, YD-909, YD-927H, ZX-1059, YDF-8170, YDF-170, YDF-175S, YDF-2001, YDF-2004 (product names of Tohto Kasei Corporation), EPICLON series of 840, 840S, 850, 850S, 850CRP, 855, 857, D-515, 860, 900IM, 1050, 1055, 2055, 3050, 4050, 4055, 7050, 9055, 830, 830S, 830LVP, 835, 835LV, EXA-1514, and EXA-4004 (product names of Dainippon Ink and Chemicals, Incorporated). These compounds may be used singly or with two or more in combination.

The above-mentioned salicylic aldehyde-type epoxy resins can be obtained, for example, by reacting a reaction product of salicylic aldehyde and phenol or cresol (salicylic aldehyde-type resin) with epichlorohydrin, and preferably include epoxy resins represented by the general formula (XIV):

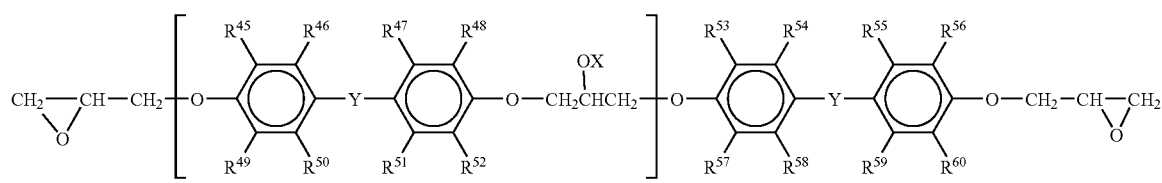

(XIII)

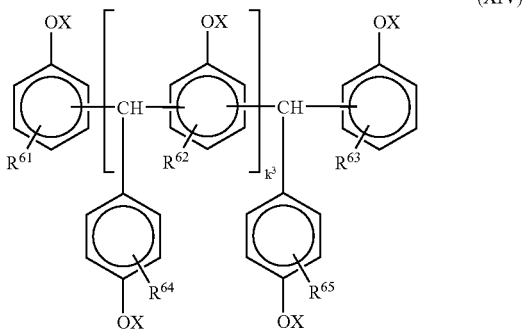

(XIV)

(wherein X has the same meaning as X in the general formula (XII); $R^{61}$ to $R^{65}$ have the same meaning as $R^{42}$ in the general formula (XII); and $k^3$ is an integer greater than or equal to 1).

Examples of available salicylic aldehyde-type epoxy resins include EPPN-501H, EPPN-501HY, EPPN-502H, and FAE-2500 (product names of Nippon Kayaku Co., Ltd.). These compounds may be used singly or with two or more in combination.

The above-mentioned rubber-modified epoxy resins can be obtained, for example, by modifying a part or all of the epoxy groups of the above-mentioned bisphenol F-type epoxy resins, bisphenol A-type epoxy resins, bisphenol S-type epoxy resins, salicylic aldehyde-type epoxy resins, phenol novolac-type epoxy resins, cresol novolac-type epoxy resins, and the like with butadiene-acrylonitrile rubber modified by carboxylic acid at both terminals (for example, CTBN, Hycar CTB and the like manufactured by Goodrich Corp.), silicone rubber having an amino-modified terminal, and the like.

Examples of available rubber modified epoxy resins include epoxydated polybutadiene modified epoxy resin: EPOLEAD PB3600, PB4700 (product names of Daicel Chemical Industries, Ltd.), EPB-13, EPB-1054 (product names of Nippon Soda Co., Ltd.), epoxydated butadiene-styrene modified epoxy resin: EPOFRIEND AT014, AT015, AT000 (product names of Daicel Chemical Industries, Ltd.), epoxy compounds of polydimethylsiloxane: X22-163B, KF100T (product names of Shin-Etsu Silicon Co., Ltd.), epoxy compounds obtained by reacting the above-mentioned epoxy compound with an α,ω-polybutadiene dicarboxylic acid, and epoxy compounds obtained by reacting part of the above-mentioned bisphenol F-type epoxy resins, bisphenol A-type epoxy resins, and bisphenol S-type epoxy resins with acrylonitrile-butadiene rubber modified by carboxylic acid at both terminals. These compounds may be used singly or with two or more in combination.

The bisphenol F-type epoxy resins and rubber-modified epoxy resins are preferred among these epoxy resins (a1) in view of their mechanical properties, adhesion, and development properties.

Furthermore, for example, hydrogenated bisphenol A-type epoxy resins and the like can be used as a part of the component (a1) as required.

Examples of the unsaturated group-containing monocarboxylic acid (a2) include acrylic acid, a dimer of acrylic acid, methacrylic acid, β-furfurylacrylic acid, β-styrylacrylic acid, cinnamic acid, crotonic acid, α-cyanocinnamic acid, half-ester compounds which are reaction products of hydroxyl group-containing acrylate and saturated or unsaturated dibasic acid anhydride, and half-esters which are reaction products of unsaturated group-containing monoglycidyl ether and saturated or unsaturated dibasic acid anhydride. These compounds may be used singly or with two or more in combination.

The above-mentioned half-esters can be obtained, for example, by reacting hydroxyl group-containing acrylate or unsaturated group-containing monoglycidyl ether with saturated or unsaturated dibasic acid anhydride in an equal mol ratio.

Examples of the hydroxyl group-containing acrylate and the unsaturated group-containing monoglycidyl ether include hydroxyethyl acrylate, hydroxyethyl methacrylate, hydroxypropyl acrylate, hydroxypropyl methacrylate, hydroxybutyl acrylate, hydroxybutyl methacrylate, polyethylene glycol monoacrylate, polyethylene glycol monomethacrylate, trimethylol propane diacrylate, trimethylol propane dimethacrylate, pentaerythritol triacrylate, pentaerythritol trimethacrylate, dipentaerythritol pentaacrylate, dipentaerythritol pentamethacrylate, glycidyl acrylate, and glycidyl methacrylate. These compounds may be used singly or with two or more in combination.

Examples of the above-mentioned saturated or unsaturated dibasic acid anhydride include succinic anhydride, maleic anhydride, tetrahydrophthalic anhydride, phthalic anhydride, methyltetrahydrophthalic anhydride, ethyltetrahydrophthalic anhydride, hexahydrophthalic anhydride, methylhexahydrophthalic anhydride, ethylhexahydrophthalic anhydride, and itaconic anhydride. These compounds may be used singly or with two or more in combination.

Furthermore, polybasic acid anhydride such as trimellitic anhydride, pyromellitic anhydride, benzophenonetetracarboxylic acid anhydride, and biphenyltetracarboxylic acid anhydride can be used as a part of the component (a2) as required.

In the above-mentioned reaction of the component (a1) and the component (a2), 0.8 to 1.05 equivalent, and more preferably 0.9 to 1.0 equivalent of the unsaturated group-containing monocarboxylic acid (a2) is preferably reacted relative to one equivalent of the epoxy group of the epoxy resin (a1).

Furthermore, the component (a1) and the component (a2) can be reacted, for example, in an organic solvent. Examples of the organic solvent include ketones such as methyl ethyl ketone and cyclohexanone; aromatic hydrocarbons such as toluene, xylene, and tetramethylbenzene; glycol ethers such as methyl cellosolve, butyl cellosolve, methyl carbitol, butyl carbitol, propylene glycol monomethyl ether, dipropylene glycol monoethyl ether, dipropylene glycol diethyl ether, and triethylene glycol monoethyl ether; esters such as ethyl acetate, butyl acetate, butyl cellosolve acetate, and carbitol acetate; aliphatic hydrocarbons such as octane and decane; petroleum solvents such as petroleum ether, petroleum naphtha, hydrogenated petroleum naphtha, and solvent naphtha. These compounds may be used singly or with two or more in combination.

Furthermore, a catalyst is preferably used to accelerate the reaction of the component (a1) and the component (a2), and examples of the catalyst include triethylamine, benzylmethylamine, methyltriethylammonium chloride, benzyltrimethylammonium chloride, benzyltrimethylammonium bromide, benzyltrimethylammonium iodide, and triphenylphosphine. These compounds may be used singly or with two or more in combination. The catalyst is preferably used in an amount of about 0.1 to about 10 parts by weight based on 100 parts by weight of the total of the component (a1) and the component (a2).

Furthermore, a polymerization inhibitor is preferably used in order to inhibit the polymerization of the component (a1) and the component (a2) during the reaction, and examples of the polymerization inhibitor include hydroquinone, methylhydroquinone, hydroquinone monomethyl ether, catechol, and pyrogallol. These compounds may be used singly or with two or more in combination. The polymerization inhibitor is preferably used in an amount of about 0.01 to about 1 parts by weight based on 100 parts by weight of the total of the component (a1) and the component (a2).

The temperature of the reaction of the above-mentioned component (a1) and component (a2) is preferably about 60° C. to about 150° C., and more preferably about 80° C. to about 120° C.

Examples of the saturated or unsaturated group-containing polybasic acid anhydride (a3), which is to be reacted with the reaction product A' of the component (a1) and the component (a2), include succinic anhydride, maleic anhydride, tetrahydrophthalic anhydride, phthalic anhydride, methyltetrahydrophthalic anhydride, ethyltetrahydrophthalic anhydride, hexahydrophthalic anhydride, methylhexahydrophthalic anhydride, ethylhexahydrophthalic anhydride, and itaconic anhydride. These compounds may be used singly or with two or more in combination.

In the reaction of the reaction product (A') and the component (a3), the acid value of the photosensitive resin (A) can be adjusted by reacting 0.1 to 1.0 equivalent of the component (a3) relative to one equivalent of the hydroxyl group of the reaction product (A').

The acid value of the photosensitive resin (A) is preferably 30 mgKOH/g or more in view of the solubility of the photosensitive resin composition in a dilute alkali solution, preferably 150 mgKOH/g or less in view of the electric properties of the resultant cured film, and more preferably 50 to 120 mgKOH/g.

The temperature of reaction of the reaction product (A') and the component (a3) is preferably about 60° C. to about 120° C.

Although methods of obtaining the photosensitive resin (A) using an epoxy resin as a raw material have been described, commercially available photosensitive resins such as ZFR1122 and ZFR1179 (product names of Nippon Kayaku Co., Ltd.) can also be used as the photosensitive resin (A). Furthermore, styrene-maleic acid-based resin such as hydroxyethyl acrylate-modified styrene-maleic anhydride copolymer or hydroxyethyl methacrylate-modified styrene-maleic anhydride copolymer can be used as a part of the photosensitive resin (A). The component (A) is preferably incorporated in an amount of 10 to 90% by weight based on the total amount of the photosensitive resin composition.

The photopolymerization initiator (B) will be described hereinafter.

Examples of the photopolymerization initiator (B) include benzoins such as benzoin, benzoin methyl ether, and benzoin isopropyl ether; acetophenones such as acetophenone, 2,2-dimethoxy-2-phenylacetophenone, 2,2-diethoxy-2-phenylacetophenone, 1,1-dichloroacetophenone, 1-hydroxycyclohexyl phenyl ketone, 2-methyl-1-[4(methylthio)phenyl]-2-morpholino-1-propanone, and N,N-dimethylaminoacetophenone: anthraquinones such as 2-methylanthraquinone, 2-ethylanthraquinone, 2-tert-butylanthraquinone, 1-chloroanthraquinone, 2-amylanthraquinone, and 2-aminoanthraquinone; thioxanthones such as 2,4-dimethylthioxanthone, 2,4-diethylthioxanthone, 2-chlorothioxanthone, and 2,4-diisopropylthioxanthone; ketals such as acetophenone dimethyl ketal and benzyl dimethyl ketal; benzophenones such as benzophenone, methylbenzophenone, 4,4'-dichlorobenzophenone, 4,4'-bis-diethylaminobenzophenone, Michler's ketone, and 4-benzoyl-4'-methyldiphenylsulfide; and 2,4,6-trimethylbenzoyldiphenylphosphine oxide. These compounds may be used singly or with two or more in combination.

The photosensitive resin composition of the present invention may contain a photopolymerization initiator auxiliary as required. Examples of the photopolymerization initiator include tertiary amines such as ethyl N,N-dimethylaminobenzoate, isoamyl N,N-dimethylaminobenzoate, pentyl-4-dimethylaminobenzoate, triethylamine, and triethanolamine. These compounds may be used singly or with two or more in combination.

The component (B) is preferably included in an amount of 0.5% or more by weight in order to ensure the photopolymerizability of the photosensitive resin, preferably 20% or less by weight in view of the heat resistance of the resultant cured material, and more preferably 2 to 15% by weight, based on the total amount of the photosensitive resin composition. When the content of the photopolymerization initiator is below 0.5% by weight, unexposed portions are prone to dissolve during development.

The flame retardant (C) will next be described. Any flame retardant can be used provided it's content of halogen atoms or antimony atoms is 5% or less by weight and that it can impart necessary flame retardancy to the photosensitive resin composition. Although compounds that do not contain halogen atoms or antimony atoms in the molecule are especially preferable, the flame retardant may contain these atoms as substituents or the like up to the above-mentioned limit.

Preferred flame retardants include, for example, a zinc compound (C1), an organic nitrogen-based compound (C2), a metal hydroxide (C3), and an organic phosphorus-based compound (C4). These compounds may be used singly or with two or more in combination.

The above-mentioned zinc compound (C1) is used as an essential component of the photosensitive resin composition I according to the present invention and may be optionally incorporated in each one of the photosensitive resin compositions II, III and IV according to the present invention.

No special limitation is imposed on the zinc compound (C1), and it can be synthesized from zinc and an acid such as molybdic acid, phosphoric acid, hexahydrooxostannic acid, stannic acid, and boric acid. Examples of the zinc compound include calcium zinc molybdate, zinc molybdate, zinc oxide, zinc phosphate, zinc hexahydrooxostannate, zinc stannate, and zinc borate, with zinc molybdate, zinc stannate, and zinc borate being preferred. These compounds may be used singly or with two or more in combination. The above-mentioned zinc compound is preferably coated onto fillers such as talc by wet process and the like, in view of costs.

Examples of available zinc compound include KEMGARD911A, KEMGARD911B, KEMGARD911C, KEMGARD981, KEMGARD425 (product names of Sherwin-Williams Japan Co., Ltd.), FLAMTARD-H, FLAMTARD-S (product names of Nippon Light Metal Co., Ltd.) and HA-1, SZB-2335, HA-S1, and HA-1T (product names of Sakai Chemical Industry Co., Ltd.).

The above-mentioned component (C1) is preferably used in an amount of 0.5% or more by weight in view of the flame retardancy of the resultant cured material, preferably 20% or less by weight in terms of the heat resistance, and more preferably 1 to 15% by weight, based on the total amount of the photosensitive resin composition.

The above-mentioned organic nitrogen-based compound (C2) is used as an essential component in the photosensitive resin composition II according to the present invention, and may be optionally incorporated into each one of the photosensitive resin compositions I, III and IV according to the present invention.

The organic nitrogen-based compound (C2) is an organic compound having one or more nitrogen atoms in the molecule, and is preferably an organic compound having at least three nitrogen atoms in the molecule, and more preferably a triazine-based compound having a six-member ring structure having three nitrogen atoms in the molecule (triazine ring including hydrotriazine ring).

As a triazine-based compound, melamine phenol compounds with repeating units represented by the general formulae (Ia) and (Ib) and melamine phenol compounds with repeating units represented by the general formulae (Ic) and (Id) are preferably used.

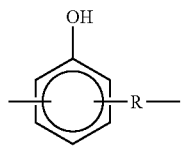

(Ia)

(wherein R represents a divalent organic group)

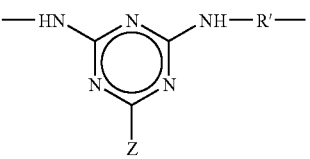

(Ib)

(wherein R' represents a divalent organic group and Z represents —NH$_2$,

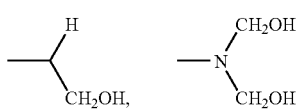

or an aryl group having 6 to 18 carbon atoms)

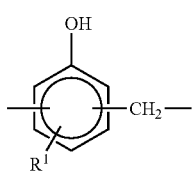

(Ic)

(wherein R$^1$ represents a hydrogen atom or a methyl group)

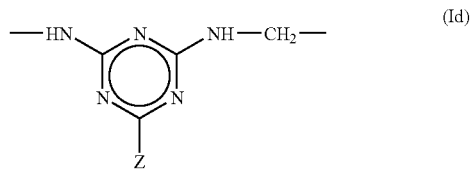

(Id)

(wherein Z is the same as Z in the above-mentioned general formula (Ib)).

Moreover, examples of the above-mentioned triazine-based compound include melamine acrylate compounds represented by the general formula (II):

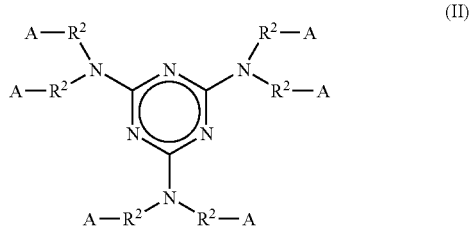

(II)

(wherein each one of six A independently represents a (meth)acryloyl group and each one of six R$^2$ independently represents a divalent organic group) triazine derivatives represented by the general formula (III):

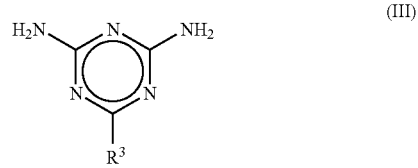

(III)

(wherein R$^3$ represents a monovalent aliphatic group having 1 to 10 carbon atoms or an aryl group having 6 to 18 carbon atoms) triazine derivatives represented by the general formula (IV):

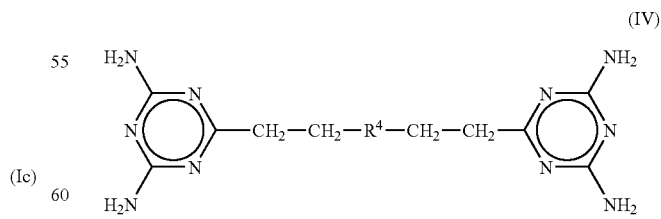

(IV)

(wherein R$^4$ represents a divalent aliphatic group having 1 to 10 carbon atoms or an arylene group having 6 to 18 carbon atoms) isocyanurate derivatives represented by the general formula (V):

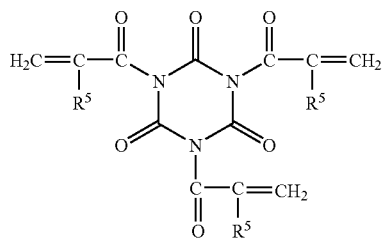

(V)

(wherein each one of three $R^5$ independently represents a hydrogen atom or a methyl group) isocyanurate derivatives represented by the general formula (VI):

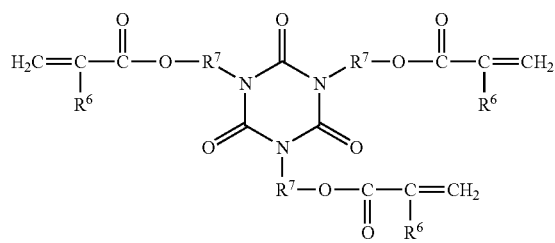

(VI)

(wherein each one of three $R^6$ independently represents a hydrogen atom or a methyl group and each one of three $R^7$ independently represents an alkylene group having 1 to 10 carbon atoms) triazine derivatives represented by the general formula (VII):

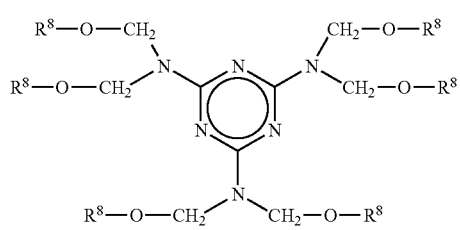

(VII)

(wherein each one of six $R^8$ independently represents an alkyl group having 1 to 10 carbon atoms) triazine derivatives represented by the general formula (VIII):

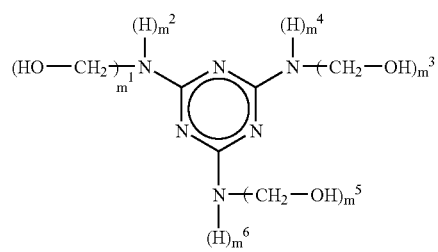

(VIII)

(wherein each one of $m^1$ to $m^6$ is independently 0, 1, or 2 and $(m^1+m^2)=(m^3+m^4)=(m^5+m^6)=2$) triazine derivatives represented by the general formula (IX):

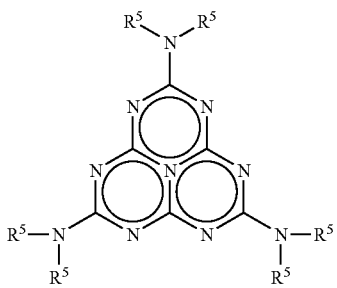

(IX)

(wherein each one of six $R^5$ is independently identical to $R^5$ in the above-mentioned general formula (V)) melamine formaldehyde resins which are copolymers of 1,3,5-triaminotriazine and formaldehyde, melamine phosphate compounds which are copolymers of 1,3,5-triaminotriazine and phosphoric acid, compounds of 1,3,5-triaminotriazine and pyrophosphoric acid, sulfuric acid-2-melamine, melamine resins which are copolymers of benzoguanamine and formaldehyde, melamine polyphosphate, triglycidyl isocyanurate, and 1,3,5-triaminotriazine. These compounds may be used singly or with two or more in combination. 1,3,5-Triaminotriazine is preferably used in view of adhesion of the photosensitive resin composition film. Triazine derivatives represented by the general formula (III), which can preferably be benzoguanamine (a compound of the general formula (III) with $R^3$ being a phenyl group), for example, are preferably used in view of availability.

In view of flame retardancy, preferred compounds include melamine phenol compounds represented by the general formulae (Ia) to (Id), melamine acrylate compounds represented by the general formula (III), triazine derivatives represented by the general formula (IV), isocyanurate derivatives represented by the general formula (V), isocyanurate derivatives represented by the general formula (VI), triazine derivatives represented by the general formula (VII), triazine derivatives represented by the general formula (VIII), triazine derivatives represented by the general formula (IX), melamine phosphate compounds which are copolymers of 1,3,5-triaminotriazine and phosphoric acid, melamine formaldehyde resins which are copolymers of 1,3,5-triaminotriazine and formaldehyde, compounds obtained by the reaction of 1,3,5-triaminotriazine and pyrophosphoric acid, sulfuric acid-2-melamine, melamine resins which are copolymers of benzoguanamine and formaldehyde, melamine polyphosphate, triglycidyl isocyanurate and the like.

No specific limitation is imposed on the melamine phenol compounds with repeating units represented by the general formulae (Ia) to (Id), provided at least one melamine unit and at least one phenol unit are present in the molecule. Furthermore, when a repeating number of melamine units and phenol units is plural, the melamine units and the phenol units may be linked either as blocks or in a random configuration.

Examples of the alkyl group having 1 to 10 carbon atoms in the general formulae (I) to (IX) include a methyl group, an ethyl group, an n-propyl group, an isopropyl group, an n-butyl group, an isobutyl group, a sec-butyl group, a tertbutyl group, a pentyl group, an isopentyl group, a neopentyl group, a hexyl group, a heptyl group, an octyl group, a nonyl group, a decyl group, and structural isomers thereof.

Examples of the alkylene group having 1 to 10 carbon atoms in the general formulae (I) to (IX) include a methylene group, an ethylene group, an n-propylene group, an isopropylene group, an n-butylene group, an isobutylene group, a sec-butylene group, a tert-butylene group, a pentylene group, an isopentylene group, a neopentylene group, a hexylene group, a heptylene group, an octylene group, a nonylene group, a decylene group, and structural isomers thereof.

Examples of the aryl group having 6 to 18 carbon atoms in the general formulae (I) to (IX) include a phenyl group, a tolyl group, a xylyl group, a biphenyl group, a naphthyl group, an anthryl group, and a phenanthryl group, and these groups may be substituted with a halogen atom, an amino group, a nitro group, a cyano group, a mercapto group, an allyl group, or an alkyl group having 1 to 20 carbon atoms.

Examples of the arylene group having 6 to 18 carbon atoms in the general formulae (I) to (IX) include a phenylene group, a tolylene group, a xylylene group, a biphenylene group, a naphthylene group, an anthrylene group, and a phenanthrylene group, and these groups may be substituted with a halogen atom, an amino group, a nitro group, a cyano group, a mercapto group, an allyl group, or an alkyl group having 1 to 20 carbon atoms.

The compounds represented by the general formulae (I) to (IX) may be substituted with a substitutable substituent such as an amino group, a nitro group, a cyano group, a mercapto group, an allyl group, or an alkyl group having 1 to 20 carbon atoms.

Examples of available organic nitrogen-based compound (C2) include 1,3,5-triaminotriazine, benzoguanamine, 1,3,5-triacryloylhexahydro-S-trizine (TAF), tris(acryloxyethyl) isocyanurate (a compound of the general formula (VI) with $R^6$ being a hydrogen atom and $R^7$ being an ethyl group), tris(methacryloxyethyl) isocyanurate (a compound of the general formula (VI) with $R^6$ being a methyl group and $R^7$ being an ethyl group), caprolactone-modified tris(acryloxyethyl) isocyanurate, hexamethoxymelamine, hexabutoxymelamine, hexamethylolmelamine, N-3A, N-6A, N-6M (product names of Shin-Nakamura Chemical Co., Ltd.), SetaCure 590, SetaCure 591 (product names of Akzo Nobel KK), Melapur 200, Melapur MC15 (product names of DSM Japan), SG102, SGO-201 (product names of Shikoku Corporation), Apinon901, P-7202, MPP-A, SB-201, SB-202, SB-203, SB-254, SB-255, SB-301, SB-302, SB-303, SB-354, SB-355 (product names of Sanwa Chemical Co., Ltd.), Planelon NP (product name of Mitsui Kagaku Fine Chemicals, Inc.), Cymel 300, Cymel 301, Cymel 303, Cymel 325, Cymel 350, Cymel 370, Cymel 1123 (product names of Mitsui Cytech Ltd.), MELAN 523, MELAN 2000, MELAN 3000 (product names of Hitachi Chemical Co., Ltd.), Melem (product name of Nissan Chemical Industries, Ltd., a compound of the general formula (IX) with $R^5$ being a hydrogen atom), PMP-100, PMP-200, and PMP-300 (product names of Nissan Chemical Industries, Ltd., melamine polyphosphate). These compounds may be used singly or with two or more in combination.

The component (C2) is used preferably in an amount of 0.2% or more by weight in view of the flame retardancy of the resultant cured film, preferably 10% or less by weight in view of heat resistance, and more preferably 0.5 to 8% by weight, based on the total amount of the photosensitive resin composition.

The above-mentioned metal hydroxide (C3) is used in the photosensitive resin composition III according to the present invention as an essential component and may be optionally incorporated in each one of the photosensitive resin compositions I, II and IV according to the present invention.

Examples of the metal hydroxide (C3) include aluminum hydroxide, magnesium hydroxide, aluminum hydroxide magnesium carbonate hydrate, nickel hydroxide, titanium hydroxide, and iridium hydroxide. These compounds may be used singly or with two or more in combination.

The component (C3) is preferably used in an amount of 5% or more by weight in view of the flame retardancy of the resultant cured film, preferably 50% or less by weight in view of heat resistance, and more preferably 10 to 40% by weight, based on the total amount of the photosensitive resin composition.

The above-mentioned organic phosphorus-based compound (C4) is used in the photosensitive resin composition IV according to the present invention as an essential component and may be optionally incorporated in each one of the photosensitive resin compositions I, II and III according to the present invention.

The organic phosphorus-based compound (C4) is an organic compound containing a phosphorus atom in the molecule, and examples of the organic phosphorus-based compound include trimethyl phosphate, triethyl phosphate, triphenyl phosphate, tricresyl phosphate, trixylenyl phosphate, cresyl phenyl phosphate, cresyl di-2,6-xylenyl phosphate, 2-methacryloyloxyethylacid phosphate, diphenyl-2-metacryloyloxyethyl phosphate, phosphate-based compounds represented by the general formula (X):

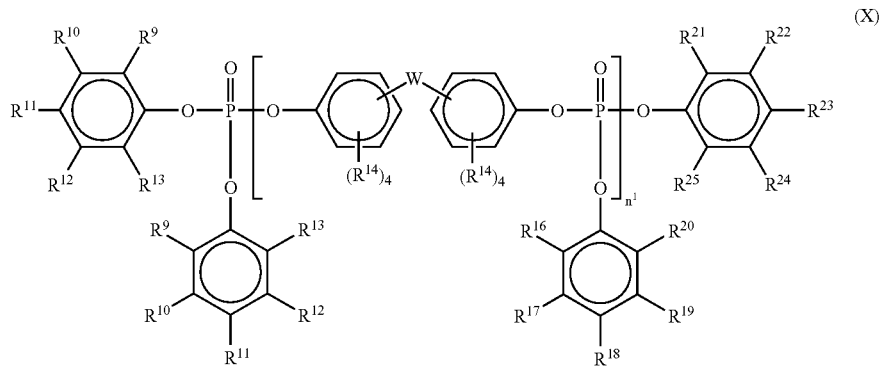

(wherein each one of $R^9$ to $R^{25}$ independently represents a hydrogen atom or an alkyl group having 1 to 10 carbon atoms; W represents a single bond, an alkylene group having 1 to 10 carbon atoms, —S—, —$SO_2$—, —O—, —CO— or —N═N—; and $n^1$ is an integer greater than or equal to 1) phosphate-based compounds represented by the general formula (XI):

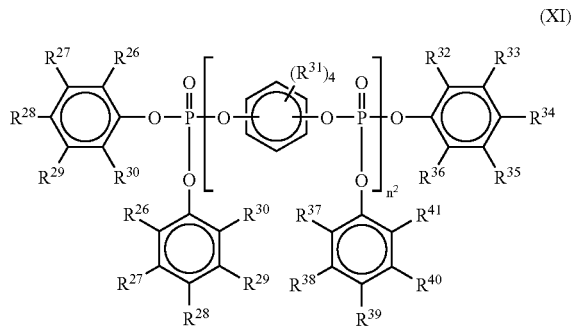

(XI)

(wherein each one of $R^{26}$ to $R^{41}$ independently represents a hydrogen atom or an alkyl group having 1 to 10 carbon atoms; and $n^2$ is an integer greater than or equal to 1) triaryl phosphate, and phosphorus-containing epoxy resins. These compounds may be used singly or with two or more in combination.

Examples of available organic phosphorus-based compound include aromatic polyphosphates such as CR-733S, CR-741, CR-747, PX-200 (product names of Daihachi Chemical Industry Co., Ltd.), SP-703, SP-601 (product names of Shikoku Corporation), and 'REOFOS' series 35, 50, 65, 95, and 110 (product names of Ajinomoto Co., Inc.). Examples of the phosphorus-containing epoxy resins include ZX-1548 series 1, 2, 3, and 4 (product names of Tohto Kasei Corporation). These compounds may be used singly or with two or more in combination.

The component (C4) is preferably used in an amount of 2% or more by weight in view of the flame retardancy of the resultant cured film, preferably 50% or less by weight in view of heat resistance, and more preferably 5 to 40% by weight, based on the total amount of the photosensitive resin composition.

The photosensitive resin composition of the present invention (that is, the above-mentioned composition X and compositions I to IV; the same also applies hereinafter) may contain a curing agent (D) as required. The curing agent preferably cures itself by the action of heat or ultraviolet or reacts with carboxyl groups, hydroxyl groups, and the like of the photosensitive resin component in the photosensitive resin composition of the present invention to cure by the action of heat or ultraviolet. Use of the above-mentioned curing agent can improve the heat resistance, adhesion, chemical resistance etc. of the final cured film.

Examples of the above-mentioned curing agent (D) include epoxy compounds, urea compounds, and oxazoline compounds. Examples of the epoxy compounds include bisphenol A-type epoxy resins, bisphenol F-type epoxy resins, hydrogenated bisphenol A-type epoxy resins, novolac type-epoxy resins, bisphenol S-type epoxy resins, heterocyclic epoxy resins such as triglycidyl isocyanurate, and bixylenol-type epoxy resins such as bixylenyl glycidyl ether of YX4000 (manufactured by Yuka Shell Epoxy Kabushiki Kaisha). Examples of the above-mentioned urea compounds include dimethylol urea and the like. These compounds may be used singly or with two or more in combination.

When the component (D) is to be incorporated, its content is preferably 2% or more by weight in view of the heat resistance of the resultant cured film, preferably 50% or less by weight in view of development properties, and more preferably 10 to 40% by weight, based on the total amount of the photosensitive resin composition.

The photosensitive resin composition of the present invention may contain an epoxy resin curing agent in order to improve various properties in the final cured film such as heat resistance, adhesion, chemical resistance and the like.

Examples of the epoxy resin curing agent include imidazoles such as 2-methylimidazole, 2-ethyl-4-methylimidazole, 1-benzyl-2-methylimidazole, 2-phenylimidazole, and 2-phenyl-4-methyl-5-hydroxymethylimidazole; amines such as diaminodiphenylmethane, phenylenediamine, xylylenediamine, diaminodiphenylsulfone, dicyandiamide, urea, and urea derivatives; organic acid salts or epoxy adducts thereof; amine complexes of trifluoroborane; triazine derivatives such as ethyldiamino-S-triazine, 2,4-diamino-S-triazine, and 2,4-diamino-6-xylyl-S-triazine; tertiary amines such as triethylamine, triethanolamine, N,N-dimethyloctylamine, N-benzyldimethylamine, pyridine, N-methylmorpholine, hexa(N-methyl)melamine, 2,4,6-tris (dimethylaminophenol)melamine, tetramethylguanidine, and m-dimethylaminophenol; polyphenols such as polyvinylphenol, phenol novolac, and alkylphenol novolac; and organic phosphines such as tributylphosphine, triphenylphosphine, and tris-2-cyanoethylphosphine. The epoxy resin curing agent is preferably used in an amount of 0.01 to 20% by weight, and more preferably 0.1 to 10% by weight, based on the total amount of the photosensitive resin composition. These epoxy resin curing agents may be used singly or with two or more in combination.

Furthermore, a diluent can be used for the photosensitive resin composition of the present invention as required. Organic solvents and photopolymerizable compounds can be used, for example, as the diluent. For the organic solvent, the above-mentioned organic solvents used for the reaction of the component (a1) and the component (a2) can be used.

For the photopolymerizable compounds, the following may be used: hydroxyalkyl (meth)acrylates such as 2-hydroxyethyl (meth)acrylates and 2-hydroxypropyl (meth)acrylates; mono or di(meth)acrylates of glycols such as ethylene glycol, methoxytetraethylene glycol, and polyethylene glycol; (meth)acrylamides such as N,N-dimethyl (meth)acrylamide and N-methylol(meth)acrylamide; aminoalkyl (meth)acrylates such as N,N-methylaminoethyl (meth)acrylate; polyvalent (meth)acrylates of polyols such as hexanediol, trimethylol propane, pentaerythritol, ditrimethylol propane, dipentaerythritol, and trishydroxyethyl isocyanurate or ethylene oxide or propylene oxide adducts of these polyol; (meth)acrylates of ethylene oxide or propylene oxide adducts of phenols such as phenoxyethyl (meth)acrylate and polyethoxy di(meth)acrylate of bisphenol A; and (meth)acrylates of glycidyl ethers such as glycerin diglycidyl ether, trimethylol propane triglycidyl ether, and triglycidyl isocyanurate. These diluents may be used singly or with two or more in combination.

When a diluent is to be used, its content is preferably 5% or more by weight in view of photosensitivity, preferably 80% or less by weight in view of heat resistance, and more preferably 10 to 70% by weight, based on the total amount of the photosensitive resin composition.

The photosensitive resin composition of the present invention may contain a known inorganic filler such as barium sulfate, barium titanate, silica, talc, calcined kaoline, magnesium carbonate, aluminum oxide, aluminum hydroxide, and mica, as required, in order to further improve properties such as adhesion and the hardness of the film. The filler is preferably included in an amount of 2 to 80% by weight and more preferably 5 to 50% by weight, based on the total amount of the photosensitive resin composition. These fillers may be used singly or with two or more in combination.

The photosensitive resin composition of the present invention may contain well-known and conventionally used additives, for example a known colorant such as phthalocyanine blue, phthalocyanine green, iodine green, disazo yellow, crystal violet, titanium oxide, carbon black, and naphthalene black; a polymerization inhibitor such as hydroquinone, methylhydroquinone, hydroquinone monomethyl ether, catechol, and pyrogallol; a thickening agent such as bentone and montmorillonite; a silicone-based, fluorine-based, or vinyl resin-based anti-foaming agent; and a silane coupling agent, as required. These additives may be used singly or with two or more in combination.

In the present invention, it is preferable to use components such as the above-mentioned additives that contain no halogen atoms or antimony atoms. Else, the content of halogen atoms or antimony atoms is preferably 1% or less by weight, and more preferably 0.5% or less by weight, based on the total solid content of the photosensitive resin composition (when the composition contains solvents such as a diluent, the weight of the solvents are excluded and a dry weight is used).

The photosensitive resin composition of the present invention, which contains the components mentioned above, can be obtained, for example, by kneading and mixing the components to homogeneity with a roll mill, a bead mill etc.

The resultant photosensitive resin composition is subjected to image formation and used for the preparation of cured films as follows. For example, the photosensitive resin composition is applied for a thickness of about 10 µm to about 200 µm onto a substrate such as flexible printed wiring boards by methods such as screen printing, spraying, roll coating, curtain coating, and electrostatic coating. After the film is dried at about 60° C. to about 110° C., a negative film is placed directly onto the film (alternatively, via a transparent film) and active rays such as ultraviolet ray is irradiated and unexposed portions are removed by being dissolved in a dilute alkali aqueous solution (development).

The exposed portions are subjected to post exposure such as UV exposure or post heating, as required, to obtain a fully cured film. The post exposure is preferably conducted at about 1 J/cm to about 5 J/cm and the post heating is preferably conducted at about 100° C. to about 200° C. for about 30 minutes to about 12 hours.

The layer of the photosensitive resin composition is laminated onto a substrate to obtain a photosensitive element, as is described in detail later.

The photosensitive resin composition of the present invention can be used in electric and electronic materials such as printed wiring boards, semiconductors and the like, and is suitable as a non-halogen, non-antimony-based photosensitive resin composition to be used as a solder mask resist, an interlayer insulating film (a build-up material), and a plating resist, which do not contain halogen-based compounds or antimony-based compounds and are superior in flame retardancy, heat resistance, mechanical properties, adhesion, and chemical resistance, in applications such as wiring boards for ball grid array, wiring boards for chip size package, flexible printed wiring boards, high-density multilayer substrates, and tape carriers.

Next, the photosensitive element according to the present invention, i.e., a photosensitive element obtained by forming a resist layer formed by any one of the above-mentioned photosensitive resin composition X and the photosensitive resin compositions I to IV onto a substrate, will be described with reference to the drawings.

FIG. 1 schematically shows an embodiment of the photosensitive element, in which the photosensitive element 1 contains a substrate 11 and a resist layer (the photosensitive resin composition layer) 12 formed thereon. For the substrate 11, a polymer film such as polyethylene terephthalate, polypropylene, polyethylene, and polyester can suitably be used. The polymer film is preferably about 5 µm to about 100 µm thick. Although no special limitation is imposed on the method of forming the resist layer 12 onto the substrate 11, the resist layer 12 can preferably be obtained by coating a solution of the photosensitive resin composition and then drying. The thickness of the photosensitive resin composition coated varies depending on the application and is preferably about 10 µto about 100 µm after drying. The coating can be conducted by the known method such as roll coater, comma coater, gravure coater, air-knife coater, die coater, bar coater, and the like. The drying can be performed at about 70° C. to about 150° C. for about 5 minutes to about 30 minutes. The amount of the organic solvent left in the resist layer 12 is preferably 2% or less by weight in order to prevent diffusion of the organic solvent in subsequent steps. The surface of the resist layer may be coated with a protective film comprising a polymer film such as polyethylene and polypropylene.

The method of producing a resist pattern according to the present invention will next be described with reference to FIG. 2, which schematically shows an example of the steps.

Figure 2A:
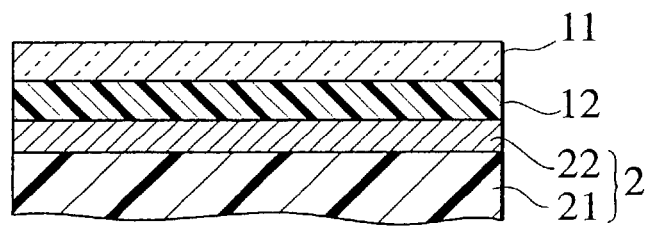
FIGS. 2A, 2B and 2C comprise a schematic drawing which shows an example of steps of the manufacturing method of a resist pattern.

Firstly, a resist layer formed by any one of the above-mentioned photosensitive resin composition X and the photosensitive resin compositions I to IV is laminated onto a substrate as a step (i). Any lamination methods may be used, and for example, as shown in FIG. 2(A) the above-mentioned photosensitive element 1 is laminated onto a substrate 2 that contains a base 21 comprising a glass fiber-filled epoxy resin and the like with a layer-to-be-processed 22 comprising copper and the like formed thereon, such that the resist layer 12 adheres to the surface of the layer-to-be-processed 22. When a protective film (not shown) is present on the resist layer 12 of the photosensitive element 1, the protective layer is removed before lamination. The lamination method can be, for example, such that the resist layer 12 is contact-bonded to the substrate 2 under a pressure of about 0.1 MPa to about 1 MPa (about 1 kgf/cm$^2$ to about 10 kgf/cm$^2$) while being heated to about 70° C. to about 130° C. Lamination under reduced pressure is also employable.

Figure 2B:
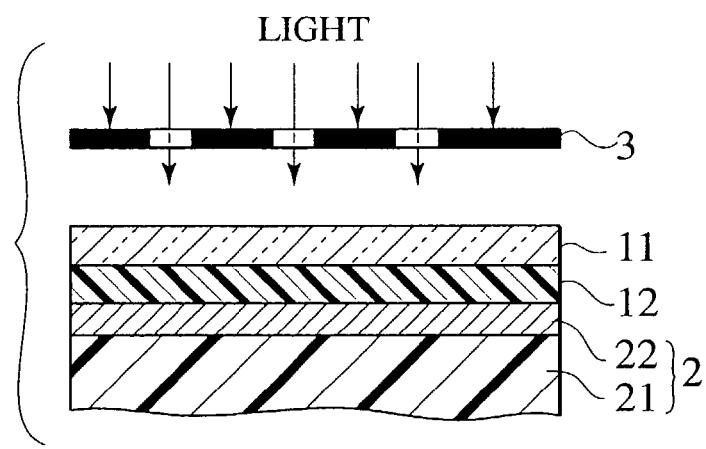

After the lamination of the resist layer is completed, active rays are irradiated in an image shape to photo-cure the resist layer at exposed portions as step (ii). An example of the method of irradiating active rays in an image shape utilizes active rays being irradiated through a mask pattern 3 to the resist layer 12 in an image shape to photo-cure the exposed portions of the resist layer 12, as shown in FIG. 2(B). The mask pattern 3 may be either negative-type or positive-type, and those generally used can be used. As the light source of the active rays, known light sources which effectively radiate ultraviolet rays, visible rays, and the like such as carbon arc lamp, mercury-vapor lamp, high pressure mercury vapor lamp, xenon lamp, and the like are employable. Alternatively, a laser beam direct imaging method is also applicable in which no mask pattern is needed.

Figure 2C:
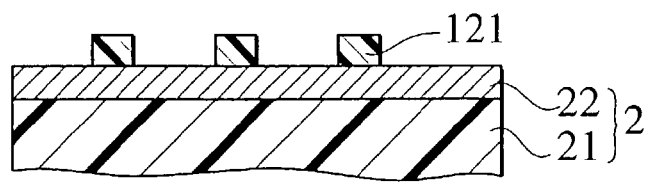

After the exposure, as step (iii), the resist layer at unexposed portions is selectively removed by development to form a resist pattern 121 as shown in FIG. 2(C). The exposure in the step (ii) can be performed in the presence of the support 11 provided the support does not interfere with irradiation to the resist layer 12, in which case the support 11 is removed before the development. The development is performed by removing the unexposed portions by wet development with developers such as alkaline aqueous solutions, water-based developers, organic solvents etc., dry development, and the like. The above-mentioned alkaline aqueous solutions are preferably used and their examples include 0.1 to 5% by weight dilute solutions of sodium carbonate, 0.1 to 5% by weight dilute solutions of potassium carbonate, and 0.1 to 5% by weight dilute solutions of sodium hydroxide. The pH of the alkaline aqueous solutions is preferably adjusted to the range of 9 to 11, and the temperature is adjusted to the development properties of the layer of the photosensitive resin composition. The alkaline aqueous solution may contain a surfactant, an antifoaming agent, an organic solvent, etc. Methods for the above-mentioned development can be any one of dipping-method, spray-method, brushing, and slapping, for example.

As a post-development treatment, heating to about 60° C. to about 250° C. or exposure in about 0.2 J/cm$^2$ to about 10 J/cm$^2$ may be conducted as required to further cure the resultant resist pattern.

The resist pattern laminated substrate according to the present invention is obtained by laminating the resist pattern obtained using the resist layer formed by any one of the above-mentioned photosensitive resin compositions X and I to IV according to the present invention onto a substrate. The laminated substrate can be produced by any known methods.

The present invention will next be described in further detail with reference to examples. 'Parts' in SYNTHESIS EXAMPLES and EXAMPLES refer to parts by weight.

SYNTHESIS EXAMPLE 1

220 Parts of YDCN704 (manufactured by Tohto Kasei Corporation, a cresol novolac-type epoxy resin), 72 parts of acrylic acid, 1.0 part of hydroquinone, and 180 parts of carbitol acetate were mixed, heated to 90° C., and stirred to dissolve the reaction mixture.

The resultant mixture was then cooled to 60° C., and 1 part of benzyltrimethylammonium chloride was added to the mixture, which was heated to 100° C. and allowed to react till the acid value reached 1 mgKOH/g.

Subsequently, 152 parts of tetrahydrophthalic anhydride and 100 parts of carbitol acetate were added to the mixture, which was heated to 80° C., reacted for 6 hours, and diluted with carbitol acetate to adjust the solid content to 60% to obtain a photosensitive resin P1.

SYNTHESIS EXAMPLE 2

330 Parts of EPPN502H (manufactured by Nippon Kayaku Co., Ltd., a salicylic aldehyde-type epoxy resin), 144 parts of acrylic acid, 1.5 part of hydroquinone, and 250 parts of carbitol acetate were mixed, heated to 90° C., and stirred to dissolve the reaction mixture.

The resultant mixture was then cooled to 60° C., and 2 parts of benzyltrimethylammonium chloride were added to the mixture, which was heated to 100° C. and allowed to react till the acid value reached 1 mgKOH/g.

Subsequently, 230 parts of tetrahydrophthalic anhydride and 180 parts of carbitol acetate were added to the mixture, which was heated to 80° C., reacted for 6 hours, and diluted with carbitol acetate to adjust the solid content to 60% to obtain a photosensitive resin P2.

SYNTHESIS EXAMPLE 3

475 Parts of YDF2001 (manufactured by Tohto Kasei Corporation, a bisphenol F-type epoxy resin), 72 parts of acrylic acid, 0.5 part of hydroquinone, and 120 parts of carbitol acetate were mixed, heated to 90° C., and stirred to dissolve the reaction mixture.

The resultant mixture was then cooled to 60° C., and 2 parts of benzyltrimethylammonium chloride were added to the mixture, which was heated to 100° C. and allowed to react till the acid value reached 1 mgKOH/g.

Subsequently, 98 parts of maleic anhydride and 85 parts of carbitol acetate were added to the mixture, which was heated to 80° C., reacted for 6 hours, and diluted with carbitol acetate to adjust the solid content to 60% to obtain a photosensitive resin P3.

EXAMPLES 1 TO 32 and COMPARATIVE EXAMPLES 1 TO 4

Components were mixed according to the formulation shown in Table 1 and kneaded with a triple roll mill to obtain compositions.

Each composition was coated onto a copper-clad laminate (MCL-RO-67G, 0.3 mm thick, manufactured by Hitachi Chemical Co., Ltd.) using a 120-mesh Tetron screen by screen printing such that it had a thickness of 30 µm after drying, which was dried in a convection type drier at 80° C. for 30 minutes.

Then, a negative mask with a predetermined pattern was allowed to adhere to the coating, which was then subjected to ultraviolet ray in 500 mJ/cm$^2$ by a UV exposing equipment.

Subsequently, spray development was conducted by spraying 1% sodium carbonate aqueous solution at a pressure of 0.18 MPa for 60 seconds to dissolve and remove unexposed portions.

The resultant image was evaluated for development properties and photosensitivity, and then heated at 150° C. for 1 hour to prepare a test board.

Each test board was tested for adhesion, acid resistance, alkali resistance, solder thermal resistance, and thermal shock resistance, as described hereinafter. Table2 summarizes the test results.

The test methods and evaluation methods are as follows.

[Adhesion]

A pattern of one hundred 1 mm-square checks was formed on each test piece according to the Japanese Industrial Standards (JIS) K5400, and the test piece was subjected to a peeling test using cellophane tape. The number of checks that peeled off was counted and graded according to the following standards.

A: The number of remaining checks is greater than or equal to ninety out of one hundred checks.

B: The number of remaining checks is greater than or equal to fifty and smaller than ninety, out of one hundred checks.

C: The number of remaining checks is greater than or equal to zero and smaller than fifty, out of one hundred checks.

[Acid Resistance]

Each test piece was immersed in 10% hydrochloric acid aqueous solution at room temperature for 30 minutes and a pattern of one hundred 1 mm-square checks was formed on each test piece according to JIS K5400, and the test piece was subjected to a peeling test using cellophane tape. The number of checks that peeled off was counted and graded according to the following standards.

A: The number of remaining checks is greater than or equal to ninety out of one hundred checks.

B: The number of remaining checks is greater than or equal to fifty and smaller than ninety, out of one hundred checks.

C: The number of remaining checks is greater than or equal to zero and smaller than fifty, out of one hundred checks.

[Alkali Resistance]

Each test piece was immersed in 5% sodium hydroxide aqueous solution at room temperature for 30 minutes and a pattern of one hundred 1 mm-square checks was formed on each test piece according to JIS K5400, and the test piece was subjected to a peeling test using cellophane tape. The number of checks that peeled off was counted and graded according to the following standards.

A: The number of remaining checks is greater than or equal to ninety out of one hundred checks.

B: The number of remaining checks is greater than or equal to fifty and smaller than ninety, out of one hundred checks.

C: The number of remaining checks is greater than or equal to zero and smaller than fifty, out of one hundred checks.

[Solder Thermal Resistance]

A test piece was coated with a rosin-based flux or a water-soluble flux and immersed in a solder bath at 260° C. for 10 seconds, which was taken as a cycle. Each test piece was subjected to six cycles and visually inspected to evaluate the appearance of the coating.

A: No change (peeling or blister) was shown on the coating and there was no creeping of solder.

B: A change (peeling or blister) or creeping of solder was shown on the coating.

[Thermal Shock Resistance]

Each test piece was subjected to a thermal hysteresis of 1000 cycles, a cycle being −55° C./30 minutes and 125° C./30 minutes, after which the test piece was visually and microscopically inspected.

A: No cracks found.

B: Cracks found.

[Flame Retardancy]

A substrate, a non-halogen copper-clad laminate (MCL-RO-67G, 0.3 mm thick) was coated with the resist at a thickness of 50 μm on both sides, from which a test piece defined in UL94V was prepared and subjected to a vertical burning test according to UL94V standards.

A: The fire did not remain till a clamp and was extinguished within 10 seconds and the test piece did not drop flaming particles which set a fire to cotton placed 305 mm below (which means achievement of UL94V-0).

B: The fire did not remain till a clamp and was extinguished within 30 seconds and the test piece did not drop flaming particles which set a fire to cotton placed 305 mm below (which means achievement of UL94V-1).

C: The test piece achieved neither UL94-0 nor UL94-1.

TABLE 1-1

| Component/% by weight | | 1 | 2 | 3 | 4 | 5 | 6 | 7 | 8 | 9 | 10 | 11 | 12 |
|---|---|---|---|---|---|---|---|---|---|---|---|---|---|
| A | Photosensitive Resin P1 | 70 | 0 | 0 | 0 | 0 | 70 | 70 | 70 | 0 | 0 | 0 | 0 |
| | Photosensitive Resin P2 | 0 | 70 | 0 | 0 | 0 | 0 | 0 | 0 | 70 | 0 | 0 | 0 |
| | Photosensitive Resin P3 | 0 | 0 | 70 | 0 | 0 | 0 | 0 | 0 | 0 | 70 | 0 | 0 |
| | ZFR1122 | 0 | 0 | 0 | 70 | 0 | 0 | 0 | 0 | 0 | 0 | 70 | 0 |
| | ZFR1179 | 0 | 0 | 0 | 0 | 70 | 0 | 0 | 0 | 0 | 0 | 0 | 70 |
| B | Irgacure 907 | 5 | 5 | 5 | 5 | 5 | 5 | 5 | 5 | 5 | 5 | 5 | 5 |
| | KAYACURE DETX-S | 0.5 | 0.5 | 0.5 | 0.5 | 0.5 | 0.5 | 0.5 | 0.5 | 0.5 | 0.5 | 0.5 | 0.5 |
| C1 | KEMGARD911A | 5 | 0 | 0 | 0 | 5 | 0 | 0 | 5 | 0 | 0 | 0 | 5 |
| | KEMGARD911C | 0 | 5 | 0 | 0 | 0 | 5 | 0 | 0 | 5 | 0 | 0 | 0 |
| | FLAMTARD-H | 0 | 0 | 5 | 0 | 0 | 0 | 5 | 0 | 0 | 5 | 0 | 0 |
| | HA-1 | 0 | 0 | 0 | 5 | 0 | 0 | 0 | 0 | 0 | 0 | 5 | 0 |
| C2 | 1,3,5-triaminotriazine | 5 | 0 | 0 | 0 | 0 | 0 | 0 | 3 | 3 | 3 | 3 | 3 |
| | SG-102 | 0 | 5 | 0 | 0 | 0 | 0 | 0 | 0 | 0 | 0 | 0 | 0 |
| | SGO-201 | 0 | 0 | 5 | 0 | 0 | 0 | 0 | 0 | 0 | 0 | 0 | 0 |
| | Melapur200 | 0 | 0 | 0 | 5 | 0 | 0 | 0 | 0 | 0 | 0 | 0 | 0 |
| | MPP-A | 0 | 0 | 0 | 0 | 5 | 0 | 0 | 0 | 0 | 0 | 0 | 0 |
| | Planelon NP | 0 | 0 | 0 | 0 | 0 | 5 | 0 | 0 | 0 | 0 | 0 | 0 |
| | N-3A | 0 | 0 | 0 | 0 | 0 | 0 | 5 | 0 | 0 | 0 | 0 | 0 |
| | Hexahydrotriazine D* | 0 | 0 | 0 | 0 | 0 | 0 | 0 | 0 | 0 | 0 | 0 | 0 |
| C3 | Aluminum hydroxide | 30 | 30 | 30 | 30 | 10 | 10 | 10 | 0 | 0 | 0 | 5 | 5 |
| C4 | CR-747 | 0 | 0 | 0 | 0 | 0 | 0 | 0 | 5 | 0 | 0 | 0 | 0 |
| | PX-200 | 0 | 0 | 0 | 0 | 0 | 0 | 0 | 0 | 5 | 0 | 0 | 0 |
| | ZX-1548-3 | 0 | 0 | 0 | 0 | 0 | 0 | 0 | 0 | 0 | 5 | 0 | 0 |
| | SP-703 | 0 | 0 | 0 | 0 | 0 | 0 | 0 | 0 | 0 | 0 | 5 | 0 |
| | REOFOS 110 | 0 | 0 | 0 | 0 | 0 | 0 | 0 | 0 | 0 | 0 | 0 | 5 |
| D | Epikote 828 | 6 | 6 | 6 | 6 | 6 | 6 | 6 | 6 | 6 | 6 | 6 | 6 |
| Colorant | Phthalocyanine Blue | 1 | 1 | 1 | 1 | 1 | 1 | 1 | 1 | 1 | 1 | 1 | 1 |
| Frame retardant | Antimony trioxide | 0 | 0 | 0 | 0 | 0 | 0 | 0 | 0 | 0 | 0 | 0 | 0 |
| | BREN-S | 0 | 0 | 0 | 0 | 0 | 0 | 0 | 0 | 0 | 0 | 0 | 0 |
| | EBR-100 | 0 | 0 | 0 | 0 | 0 | 0 | 0 | 0 | 0 | 0 | 0 | 0 |
| Diluent | KAYARAD DPHA | 5 | 5 | 5 | 5 | 5 | 5 | 5 | 5 | 5 | 5 | 5 | 5 |
| Filler | Silica | 0 | 0 | 0 | 0 | 10 | 10 | 10 | 20 | 20 | 20 | 15 | 15 |
| | Barium sulfate | 0 | 0 | 0 | 0 | 10 | 10 | 10 | 10 | 10 | 10 | 10 | 10 |

Hexahydrotriazine D*: 1,3,5-triacryloylhexahydro-S-triazine

TABLE 1-2

| Component/% by weight | | Examples | | | | | | | | | | | |
|---|---|---|---|---|---|---|---|---|---|---|---|---|---|
| | | 13 | 14 | 15 | 16 | 17 | 18 | 19 | 20 | 21 | 22 | 23 | 24 |
| A | Photosensitive Resin P1 | 70 | 0 | 0 | 0 | 70 | 0 | 0 | 0 | 70 | 0 | 0 | 0 |
| | Photosensitive Resin P2 | 0 | 70 | 0 | 0 | 0 | 70 | 0 | 0 | 0 | 70 | 0 | 0 |
| | Photosensitive Resin P3 | 0 | 0 | 70 | 0 | 0 | 0 | 70 | 0 | 0 | 0 | 70 | 0 |
| | ZFR1122 | 0 | 0 | 0 | 0 | 0 | 0 | 0 | 0 | 0 | 0 | 0 | 0 |
| | ZFR1179 | 0 | 0 | 0 | 70 | 0 | 0 | 0 | 70 | 0 | 0 | 0 | 70 |
| B | Irgacure 907 | 4 | 4 | 4 | 4 | 4 | 4 | 4 | 4 | 5 | 5 | 5 | 5 |
| | KAYACURE DETX-S | 0.5 | 0.5 | 0.5 | 0.5 | 0.5 | 0.5 | 0.5 | 0.5 | 0.5 | 0.5 | 0.5 | 0.5 |
| C1 | KEMGARD911A | 5 | 0 | 0 | 5 | 5 | 0 | 0 | 5 | 5 | 0 | 0 | 5 |
| | KEMGARD911C | 0 | 0 | 0 | 0 | 0 | 0 | 0 | 0 | 0 | 0 | 0 | 0 |
| | FLAMTARD-H | 0 | 0 | 0 | 0 | 0 | 0 | 0 | 0 | 0 | 0 | 0 | 0 |
| | HA-1 | 0 | 0 | 0 | 0 | 0 | 0 | 0 | 0 | 0 | 0 | 0 | 0 |
| C2 | 1,3,5-triaminotriazine | 0 | 0 | 0 | 0 | 0 | 0 | 0 | 0 | 5 | 0 | 0 | 0 |
| | SG-102 | 0 | 0 | 0 | 0 | 0 | 0 | 0 | 0 | 0 | 5 | 0 | 0 |
| | SGO-201 | 0 | 0 | 0 | 0 | 0 | 0 | 0 | 0 | 0 | 0 | 5 | 0 |
| | Melapur200 | 5 | 5 | 5 | 5 | 0 | 0 | 0 | 0 | 0 | 0 | 0 | 0 |
| | MPP-A | 0 | 0 | 0 | 0 | 0 | 0 | 0 | 0 | 0 | 0 | 0 | 5 |
| | Planelon NP | 0 | 0 | 0 | 0 | 0 | 0 | 0 | 0 | 0 | 0 | 0 | 0 |
| | N-3A | 0 | 0 | 0 | 0 | 5 | 5 | 0 | 0 | 0 | 0 | 0 | 0 |
| | Hexahydrotriazine D* | 0 | 0 | 0 | 0 | 0 | 0 | 5 | 5 | 0 | 0 | 0 | 0 |
| C3 | Aluminum hydroxide | 30 | 30 | 30 | 30 | 30 | 30 | 30 | 30 | 30 | 30 | 30 | 10 |
| C4 | CR-747 | 5 | 5 | 5 | 0 | 5 | 5 | 5 | 0 | 5 | 5 | 5 | 0 |
| | PX-200 | 0 | 0 | 0 | 0 | 0 | 0 | 0 | 0 | 0 | 0 | 0 | 0 |
| | ZX-1548-3 | 0 | 0 | 0 | 0 | 0 | 0 | 0 | 0 | 0 | 0 | 0 | 0 |
| | SP-703 | 0 | 0 | 0 | 0 | 0 | 0 | 0 | 0 | 0 | 0 | 0 | 0 |
| | REOFOS 110 | 0 | 0 | 0 | 0 | 0 | 0 | 0 | 0 | 0 | 0 | 0 | 0 |
| D | Epikote 828 | 6 | 6 | 6 | 6 | 6 | 6 | 6 | 6 | 6 | 6 | 6 | 6 |
| Colorant | Phthalocyanine Blue | 1 | 1 | 1 | 1 | 1 | 1 | 1 | 1 | 1 | 1 | 1 | 1 |
| Frame Retardant | Antimony trioxide | 0 | 0 | 0 | 0 | 0 | 0 | 0 | 0 | 0 | 0 | 0 | 0 |
| | BREN-S | 0 | 0 | 0 | 0 | 0 | 0 | 0 | 0 | 0 | 0 | 0 | 0 |
| | EBR-100 | 0 | 0 | 0 | 0 | 0 | 0 | 0 | 0 | 0 | 0 | 0 | 0 |
| Diluent | KAYARAD DPHA | 4 | 4 | 4 | 4 | 4 | 4 | 4 | 4 | 5 | 5 | 5 | 5 |
| Filler | Silica | 0 | 0 | 0 | 0 | 0 | 0 | 0 | 0 | 0 | 0 | 0 | 10 |
| | Barium sulfate | 0 | 0 | 0 | 0 | 0 | 0 | 0 | 0 | 0 | 0 | 0 | 10 |

Hexahydrotriazine D*: 1,3,5-triacryloylhexahydro-S-triazine

TABLE 1-3

| Component/% by weight | | Examples | | | | | | | | Comparative Examples | | | |
|---|---|---|---|---|---|---|---|---|---|---|---|---|---|
| | | 25 | 26 | 27 | 28 | 29 | 30 | 31 | 32 | 1 | 2 | 3 | 4 |
| A | Photosensitive Resin P1 | 70 | 70 | 70 | 70 | 0 | 70 | 70 | 70 | 70 | 0 | 70 | 0 |
| | Photosensitive Resin P2 | 0 | 0 | 0 | 0 | 70 | 0 | 0 | 0 | 0 | 70 | 0 | 70 |
| | Photosensitive Resin P3 | 0 | 0 | 0 | 0 | 0 | 0 | 0 | 0 | 0 | 0 | 0 | 0 |
| | ZFR1122 | 0 | 0 | 0 | 0 | 0 | 0 | 0 | 0 | 0 | 0 | 0 | 0 |
| | ZFR1179 | 0 | 0 | 0 | 0 | 0 | 0 | 0 | 0 | 0 | 0 | 0 | 0 |
| B | Irgacure 907 | 5 | 5 | 5 | 4 | 4 | 5 | 5 | 5 | 5 | 5 | 5 | 5 |
| | KAYACURE DETX-S | 0.5 | 0.5 | 0.5 | 0.5 | 0.5 | 0.5 | 0.5 | 0.5 | 0.5 | 0.5 | 0.5 | 0.5 |
| C1 | KEMGARD911A | 0 | 0 | 0 | 0 | 0 | 5 | 0 | 0 | 0 | 0 | 0 | 0 |
| | KEMGARD911C | 0 | 0 | 0 | 0 | 0 | 0 | 0 | 0 | 0 | 0 | 0 | 0 |
| | FLAMTARD-H | 0 | 0 | 0 | 0 | 0 | 0 | 0 | 0 | 0 | 0 | 0 | 0 |
| | HA-1 | 0 | 0 | 0 | 0 | 0 | 0 | 0 | 0 | 0 | 0 | 0 | 0 |
| C2 | 1,3,5-triaminotriazine | 0 | 0 | 5 | 5 | 5 | 0 | 0 | 0 | 0 | 0 | 0 | 5 |
| | SG-102 | 0 | 0 | 0 | 0 | 0 | 0 | 0 | 0 | 0 | 0 | 0 | 0 |
| | SGO-201 | 0 | 0 | 0 | 0 | 0 | 0 | 0 | 0 | 0 | 0 | 0 | 0 |
| | Melapur200 | 0 | 0 | 0 | 0 | 0 | 0 | 0 | 0 | 0 | 0 | 0 | 0 |
| | MPP-A | 0 | 0 | 0 | 0 | 0 | 0 | 0 | 0 | 0 | 0 | 0 | 0 |
| | Planelon NP | 5 | 0 | 0 | 0 | 0 | 0 | 0 | 0 | 0 | 0 | 0 | 0 |
| | N-3A | 0 | 5 | 0 | 0 | 0 | 0 | 0 | 0 | 0 | 0 | 0 | 0 |
| | Hexahydrotriazine D* | 0 | 0 | 0 | 0 | 0 | 0 | 0 | 0 | 0 | 0 | 0 | 0 |
| C3 | Aluminum hydroxide | 10 | 10 | 0 | 0 | 0 | 0 | 10 | 0 | 0 | 0 | 0 | 0 |
| C4 | CR-747 | 0 | 0 | 0 | 0 | 0 | 0 | 0 | 5 | 0 | 0 | 0 | 0 |
| | PX-200 | 0 | 0 | 0 | 0 | 0 | 0 | 0 | 0 | 0 | 0 | 0 | 0 |
| | ZX-1548-3 | 0 | 0 | 0 | 0 | 0 | 0 | 0 | 0 | 0 | 0 | 0 | 0 |
| | SP-703 | 0 | 0 | 0 | 0 | 0 | 0 | 0 | 0 | 0 | 0 | 0 | 0 |
| | REOFOS 110 | 0 | 0 | 0 | 0 | 0 | 0 | 0 | 0 | 0 | 0 | 0 | 0 |
| D | Epikote 828 | 6 | 6 | 6 | 6 | 6 | 6 | 6 | 6 | 6 | 6 | 6 | 6 |
| Colorant | Phthalocyanine Blue | 1 | 1 | 1 | 1 | 1 | 1 | 1 | 1 | 1 | 1 | 1 | 1 |
| Frame retardant | Antimony trioxide | 0 | 0 | 0 | 0 | 0 | 0 | 0 | 0 | 0 | 5 | 0 | 5 |
| | BREN-S | 0 | 0 | 0 | 0 | 0 | 0 | 0 | 0 | 0 | 0 | 0 | 10 |
| | EBR-100 | 0 | 0 | 0 | 0 | 0 | 0 | 0 | 0 | 0 | 0 | 5 | 0 |
| Diluent | KAYARAD DPHA | 5 | 5 | 5 | 4 | 4 | 5 | 5 | 5 | 5 | 5 | 5 | 5 |

TABLE 1-3-continued

|  |  | Examples | | | | | | | | Comparative Examples | | | |
|---|---|---|---|---|---|---|---|---|---|---|---|---|---|
| Component/% by weight | | 25 | 26 | 27 | 28 | 29 | 30 | 31 | 32 | 1 | 2 | 3 | 4 |
| Filler | Silica | 10 | 10 | 20 | 15 | 15 | 20 | 20 | 20 | 20 | 20 | 20 | 20 |
|  | Barium sulfate | 10 | 10 | 10 | 15 | 15 | 10 | 10 | 10 | 10 | 10 | 10 | 10 |

Hexahydrotriazine D*: 1,3,5-triacryloylhexahydro-S-triazine

TABLE 2

|  | Examples | | | | | | | | | | | |
|---|---|---|---|---|---|---|---|---|---|---|---|---|
| Evaluation | 1 | 2 | 3 | 4 | 5 | 6 | 7 | 8 | 9 | 10 | 11 | 12 |
| Halogen content/wt % | 0 | 0 | 0 | 0 | 0 | 0 | 0 | 0 | 0 | 0 | 0 | 0 |
| Antimony content/wt % | 0 | 0 | 0 | 0 | 0 | 0 | 0 | 0 | 0 | 0 | 0 | 0 |
| Adhesion | A | A | A | A | A | A | A | A | A | A | A | A |
| Acid resistance | A | A | A | A | A | A | A | A | A | A | A | A |
| Alkali resistance | A | A | A | A | A | A | A | A | A | A | A | A |
| Solder thermal resistance | A | A | A | A | A | A | A | A | A | A | A | A |
| Thermal shock resistance | A | A | A | A | A | A | A | A | A | A | A | A |
| Frame retardancy | A | A | A | A | A | A | A | A | A | A | A | A |

|  | Examples | | | | | | | | | | | |
|---|---|---|---|---|---|---|---|---|---|---|---|---|
| Evaluation | 13 | 14 | 15 | 16 | 17 | 18 | 19 | 20 | 21 | 22 | 23 | 24 |
| Halogen content/wt % | 0 | 0 | 0 | 0 | 0 | 0 | 0 | 0 | 0 | 0 | 0 | 0 |
| Antimony content/wt % | 0 | 0 | 0 | 0 | 0 | 0 | 0 | 0 | 0 | 0 | 0 | 0 |
| Adhesion | A | A | A | A | A | A | A | A | A | A | A | A |
| Acid resistance | A | A | A | A | A | A | A | A | A | A | A | A |
| Alkali resistance | A | A | A | A | A | A | A | A | A | A | A | A |
| Solder thermal resistance | A | A | A | A | A | A | A | A | A | A | A | A |
| Thermal shock resistance | A | A | A | A | A | A | A | A | A | A | A | A |
| Frame retardancy | A | A | A | A | A | A | A | A | A | A | A | A |

|  | Examples | | | | | | | | Comparative Examples | | | |
|---|---|---|---|---|---|---|---|---|---|---|---|---|
| Evaluation | 25 | 26 | 27 | 28 | 29 | 30 | 31 | 32 | 1 | 2 | 3 | 4 |
| Halogen content/wt % | 0 | 0 | 0 | 0 | 0 | 0 | 0 | 0 | 0 | 0 | 41 | 35 |
| Antimony content/wt % | 0 | 0 | 0 | 0 | 0 | 0 | 0 | 0 | 0 | 84 | 0 | 84 |
| Adhesion | A | A | A | A | A | A | A | A | A | A | A | A |
| Acid resistance | A | A | B | B | B | B | B | B | C | C | C | A |
| Alkali resistance | A | A | A | A | A | A | A | A | A | A | A | A |
| Solder thermal resistance | A | A | A | A | A | A | A | A | A | A | A | A |
| Thermal shock resistance | A | A | A | A | B | A | A | A | A | B | A | B |
| Frame retardancy | A | A | B | B | B | A | A | A | C | A | A | A |

Note:
Each one of the contents of halogen and antimony in the table shows a content of corresponding atoms in the frame retardant.

Each component shown in Formulation Table will be described as below.

ZFR1122: acid-containing epoxy resin (manufactured by Nippon Kayaku Co., Ltd., solid content of 60% by weight)

ZFR1179: acid-containing rubber-modified epoxy resin (manufactured by Nippon Kayaku Co., Ltd., solid content of 60% by weight)

Irgacure 907: 2-methy-[4-(methylthio)phenyl]morpholino-1-propanone (manufactured by Ciba Specialty Chemicals in Japan)

KAYACURE DETX-S: 2,4-diethylthioxanthone (manufactured by Nippon Kayaku Co., Ltd.,)

KEMGARD911A: zinc molybdate compound (manufactured by Sherwin-Williams Japan Co., Ltd.)

KEMGARD911C: zinc molybdate compound (manufactured by Sherwin-Williams Japan Co., Ltd.)

FLAMTARD-H: zinc stannate compound (manufactured by Nippon Light Metal Co., Ltd.)

HA-1: zinc borate compound (manufactured by Sakai Chemical Industry Co., Ltd.)

SG-102: triazine derivative (manufactured by Shikoku Corporation)

SGO-201: triazine derivative (manufactured by Shikoku Corporation)

Melapur 200: copolymer of 1,3,5-triaminotriazine and phosphoric acid (manufactured by DSM Japan)

MPP-A: melamine phosphate derivative (manufactured by Sanwa Chemical Co., Ltd.)

Planelon NP: triazine derivative (manufactured by Mitsui Kagaku Fine Chemicals, Inc.)

N-3A: melamine acrylate (manufactured by Shin-Nakamura Chemical Co., Ltd.)

Epikote 828: bisphenol A-type epoxy resin (manufactured by Yuka Shell Epoxy Kabushiki Kaisha)

BREN-S: bromine-containing epoxy resin (manufactured by Nippon Kayaku Co., Ltd.; bromine content of 35% by weight)

EBR-100: brominated bisphenol A-type epoxy acrylate resin (manufactured by MANAC Corporation; bromine content of 41% by weight)

KAYARAD DPHA: dipentaerythritol pentaacrylate (manufactured by Nippon Kayaku Co., Ltd.)

CR-747: phosphate compound (manufactured by Daihachi Chemical Industry Co., Ltd.; a compound represented by the general formula (X) with $R^9$ to $R_{12}$, $R_{14}$ to $R^{19}$, and $R^{21}$ to $R_{211}$ being a hydrogen atom and $R^{13}$, $R^{20}$, and $R^{21}$ being a methyl group, and W being a propylene group) PX-200: phosphate compound (manufactured by Daihachi Chemical Industry Co., Ltd.)

ZX-1548-3: phosphorus-containing epoxy resin (manufactured by Tohto Kasei Corporation)

SP-703: phosphate compound (manufactured by Shikoku Corporation)

REOFOS 110: phosphate compound (manufactured by Ajinomoto Co., Inc.)

The disclosure of the present application is related to the subject matter described in Japanese Patent Application No.11-300995 filed on Oct. 22, 1999, Japanese Patent Application No.11-307516 filed on Oct. 28, 1999, Japanese Patent Application No.11-307946 filed on Oct. 29, 1999, Japanese Patent Application No.11-307947 filed on Oct. 29, 1999, and Japanese Patent Application No.2000-196492 filed on Jun. 29, 2000, the disclosure of which is incorporated herein by reference.

It is to be noted that, besides those already mentioned above, various changes and modifications can be made in the above-mentioned embodiments without departing from the novel and advantageous features of the present invention. Therefore, all such changes and modifications are intended to be included within the scope of the appended claims.

What is claimed is:

1. A photosensitive resin composition comprising a photosensitive resin (A), a photopolymerization initiator (B), and a flame retardant (C), wherein the photosensitive resin (A) is obtained by reacting a reaction Product of epoxy resin (a1) and unsaturated group-containing monocarboxylic acid (a2), with anhydride (a3) of saturated or unsaturated group-containing polybasic acid, and the epoxy resin (a1) is selected from the group consisting of novolac-type epoxy resins, bisphenol-type epoxy resins, salicylic aldehyde-type epoxy resins, and rubber-modified epoxy resins;

the flame retardant (C) comprises a metal hydroxide (C3) and a triazine-based compound (C2), and the component (C3) is included in an amount of 10 to 40% by weight, and the component (C2) is included in an amount of 0.5 to 8% by weight, based on the total amount of the composition.

2. The photosensitive resin composition according to claim 1, wherein the metal hydroxide (C3) is selected from the group consisting of aluminum hydroxide, magnesium hydroxide, aluminum hydroxide magnesium carbonate hydrate, nickel hydroxide, titanium hydroxide, and iridium hydroxide.

3. The photosensitive resin composition according to claim 1, further comprising an organic phosphorus-based compound (C4).

4. The photosensitive resin composition according to claim 1, wherein the component (A) is included in an amount of 10 to 90% by weight, and the component (B) is included in an amount of 0.5 to 20% by weight, based on the total amount of the composition.

5. The photosensitive resin composition according to claim 3, wherein a content of the component (C4) is 2 to 50% by weight based on the total amount of the composition.

6. The photosensitive resin composition according to claim 3, wherein the organic phosphorus-based compound (C4) is selected from the group consisting of phosphate-based compounds represented by the general formula (X):

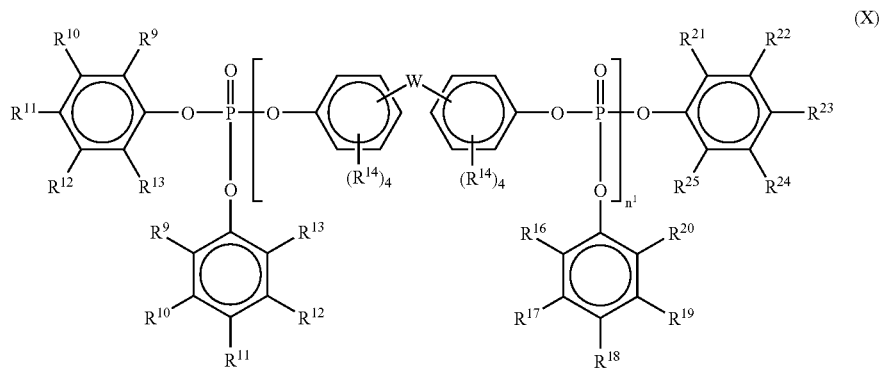

(wherein each one of $R^9$ to $R^{25}$ independently represents a hydrogen atom or an alkyl group having 1 to 10 carbon atoms; W represents a single bond, an alkylene group having 1 to 10 carbon atoms, —S—, —SO$_2$—, —O—, —CO— or —N=N—; and $n^1$ is an integer greater than or equal to 1), phosphate-based compounds represented by the general formula (XI):

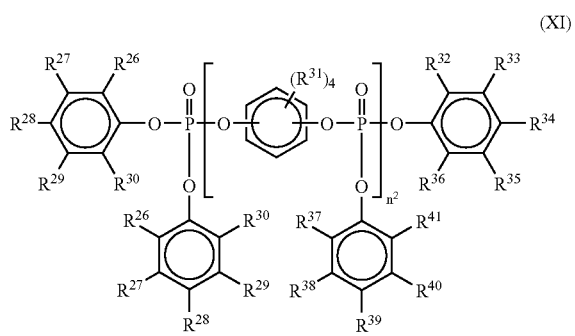

(XI)

(wherein each one of $R^{26}$ to $R^{41}$ independently represents a hydrogen atom or an alkyl group having 1 to 10 carbon atoms; and $n^2$ is an integer greater than or equal to 1), and phosphorus-containing epoxy resins.

7. The photosensitive resin composition according to claim 3, wherein a content of the component (C4) is 2 to 50% by weight, based on the total amount of the composition.

8. The photosensitive resin composition according to claim 1, further comprising a curing agent (D).

9. The photosensitive resin composition according to claim 8, wherein a content of the component (D) is 2 to 50% by weight based on the total amount of the composition.

10. The photosensitive resin composition according to claim 1, wherein the triazine-based compound is a melamine phenol compound with repeating units represented by the general formulae (Ia) and (Ib):

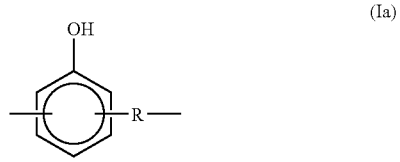

(Ia)

(wherein R represents a divalent organic group)

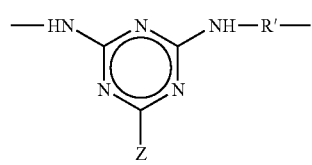

(Ib)

(wherein R' represents a divalent organic group and Z represents —$NH_2$,

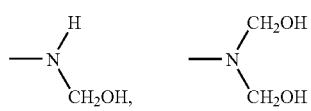

or an aryl group having 6 to 18 carbon atoms).

11. The photosensitive resin composition according to claim 1, wherein the triazine-based compound is a melamine phenol compound with repeating units represented by the general formulae (Ic) and (Id):

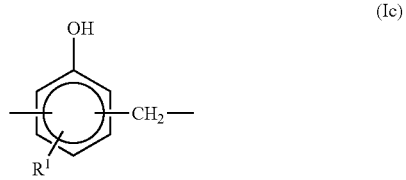

(Ic)

(wherein $R^1$ represents a hydrogen atom or a methyl group)

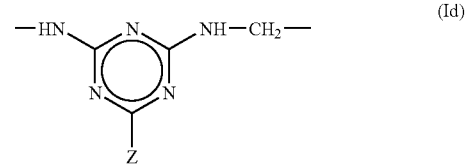

(Id)

(wherein Z represents —$NH_2$).

12. The photosensitive resin composition according to claim 1, wherein the triazine-based compound is a melamine acrylate compound represented by the general formula (II):

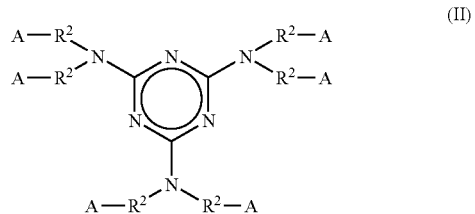

(II)

(wherein each one of six A independently represents a (meth)acryloyl group and each one of six $R^2$ independently represents a divalent organic group).

13. photosensitive resin composition according to claim 1, wherein the triazine-based compound is a triazine derivative represented by the general formula (III):

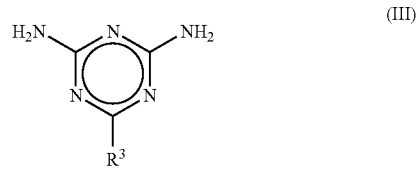

(III)

(wherein $R^3$ represents a monovalent aliphatic group having 1 to 10 carbon atoms or an aryl group having 6 to 18 carbon atoms).

14. The photosensitive resin composition according to claim 1, wherein the triazine-based compound is a triazine derivative represented by the general formula (IV):

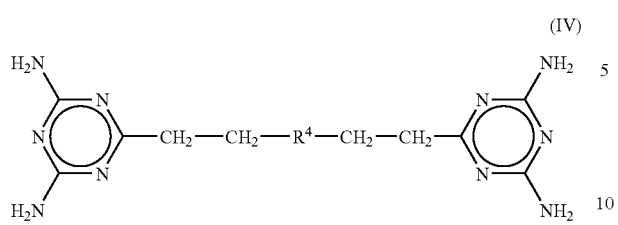

(IV)

(wherein $R^4$ represents a divalent aliphatic group having 1 to 10 carbon atoms or an arylene group having 6 to 18 carbon atoms).

15. The photosensitive resin composition according to claim 1, wherein the triazine-based compound is an isocyanurate derivative represented by the general formula (V):

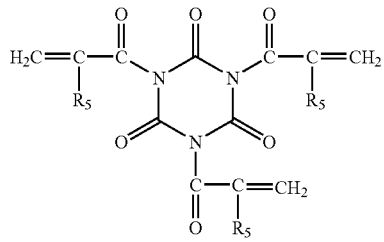

(V)

(wherein each one of three $R^5$ independently represents a hydrogen atom or a methyl group).

16. The photosensitive resin composition according to claim 1, wherein the triazine-based compound is an isocyanurate derivative represented by the general formula (VI):

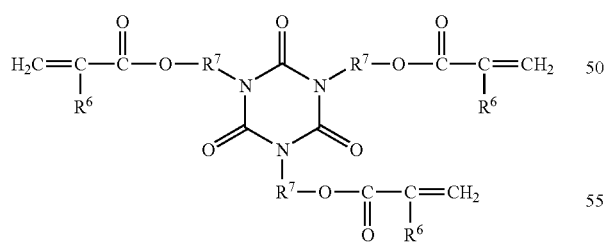

(VI)

(wherein each one of three $R^6$ independently represents a hydrogen atom or a methyl group and each one of three $R^7$ independently represents an alkylene group having 1 to 10 carbon atoms).

17. The photosensitive resin composition according to claim 1, wherein the triazine-based compound is a triazine derivative represented by the general formula (VII):

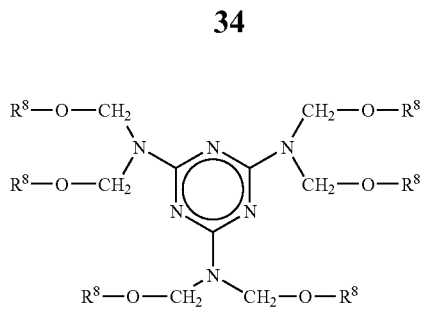

(wherein each one of six $R^8$ independently represents an alkyl group having 1 to 10 carbon atoms).

18. The photosensitive resin composition according to claim 1, wherein the triazine-based compound is a triazine derivative represented by the general formula (VIII):

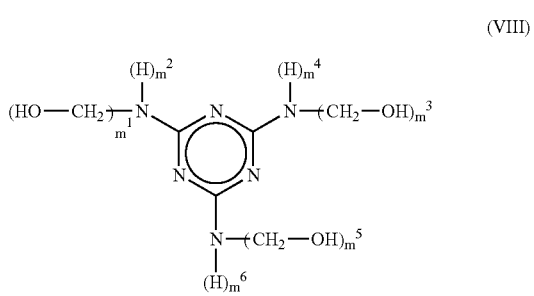

(VIII)

(wherein each one of $m^1$ to $m^6$ is independently 0, 1, or 2 and $(m^1+m^2)=(m^3+m^4)=(m^5+m^6)=2$).

19. The photosensitive resin composition according to claim 1, wherein the triazine-based compound is a triazine derivative represented by the general formula (IX):

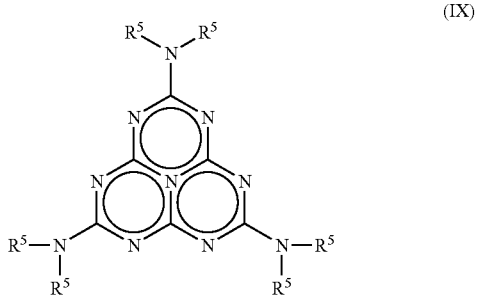

(IX)

(wherein each one of six $R^5$ independently represents a hydrogen atom or a methyl group).

20. The photosensitive resin composition according to claim 1, wherein the triazine-based compound is selected from the group consisting of melamine formaldehyde resins which are copolymers of 1,3,5-triaminotriazine and formaldehyde, melamine phosphate compounds which are copolymers of 1,3,5-triaminotriazine and phosphoric acid, compounds of 1,3,5-triaminotriazine and pyrophosphoric acid, sulfuric acid-2-melamine, melamine resins which are copolymers of benzoguanamine and formaldehyde, melamine polyphosphate, and triglycidyl isocyanurate.

21. The photosensitive resin composition according to claim 1, wherein the triazine-based compound is 1,3,5-triaminotriazine.

22. The photosensitive resin composition according to claim 1, further comprising a zinc compound (C1).

23. The photosensitive resin composition according to claim 22, wherein the zinc compound (C1) is synthesized from an acid and zinc.

24. The photosensitive resin composition according to claim 23, wherein the acid is selected from the group consisting of molybdic acid, phosphoric acid, hexahydrooxostannic acid, stannic acid, and boric acid.

25. The photosensitive resin composition according to claim 22, wherein the zinc compound (C1) is selected from the group consisting of calcium zinc molybdate, zinc molybdate, zinc oxide, zinc phosphate, zinc hexahydrooxostannate, zinc stannate, and zinc borate.

26. The photosensitive resin composition according to claim 22, further comprising an organic phosphorus-based compound (C4).

27. The photosensitive resin composition according to claim 22, wherein a content of the component (C1) is 0.5 to 20% by weight based on the total amount of the composition.

28. A photosensitive element obtained by forming onto a substrate a resist layer comprising a photosensitive resin composition according to claim 1.

29. A manufacturing method of a resist pattern comprising:

i) laminating a resist layer comprising a photosensitive resin composition according to claim 1 onto a substrate;

ii) irradiating active rays in an image shape to photo-cure the resist layer at exposed portions; and iii) selectively removing the resist layer at unexposed portions by development to form a resist pattern.

30. A resist pattern manufactured by the manufacturing method of a resist pattern according to claim 29.

31. A resist pattern laminated substrate obtained by laminating, onto a substrate, a resist pattern obtained using a resist layer comprising a photosensitive resin composition according to claim 1.

* * * * *

UNITED STATES PATENT AND TRADEMARK OFFICE
CERTIFICATE OF CORRECTION

PATENT NO. : 7,049,036 B1 Page 1 of 1
APPLICATION NO. : 10/110219
DATED : May 23, 2006
INVENTOR(S) : K. Satou et al.

It is certified that error appears in the above-identified patent and that said Letters Patent is hereby corrected as shown below:

On the cover page, at item (30), Foreign Application Priority Data, the following priority should be included:
--June 29, 2000 (JP) 2000-196492--

At column 29, line 67 (claim 1, line 5 "Product" should be --Product--.

Signed and Sealed this

Twenty-sixth Day of September, 2006

JON W. DUDAS
*Director of the United States Patent and Trademark Office*

UNITED STATES PATENT AND TRADEMARK OFFICE
CERTIFICATE OF CORRECTION

| | | |
|---|---|---|
| PATENT NO. | : 7,049,036 B1 | |
| APPLICATION NO. | : 10/110219 | |
| DATED | : May 23, 2006 | |
| INVENTOR(S) | : K. Satou et al. | |

It is certified that error appears in the above-identified patent and that said Letters Patent is hereby corrected as shown below:

On the cover page, at item (30), Foreign Application Priority Data, the following priority should be included:
--June 29, 2000 (JP) 2000-196492--

At column 29, line 67 (claim 1, line 5) "Product" should be --product--.

This certificate supersedes Certificate of Correction issued September 26, 2006.

Signed and Sealed this

Second Day of January, 2007

JON W. DUDAS
*Director of the United States Patent and Trademark Office*